(12) United States Patent
Ichihashi et al.

(10) Patent No.: US 11,476,853 B2
(45) Date of Patent: Oct. 18, 2022

(54) LEVEL SHIFT CIRCUIT AND ELECTRONIC APPARATUS

(71) Applicant: SONY SEMICONDUCTOR SOLUTIONS CORPORATION, Kanagawa (JP)

(72) Inventors: Masahiro Ichihashi, Kanagawa (JP); Tetsuya Tashiro, Kanagawa (JP); Yasunori Tsukuda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/291,745

(22) PCT Filed: Nov. 6, 2019

(86) PCT No.: PCT/JP2019/043468
§ 371 (c)(1),
(2) Date: May 6, 2021

(87) PCT Pub. No.: WO2020/100681
PCT Pub. Date: May 22, 2020

(65) Prior Publication Data
US 2022/0014194 A1    Jan. 13, 2022

(30) Foreign Application Priority Data

Nov. 14, 2018 (JP) .............................. JP2018-213670

(51) Int. Cl.
*H03K 19/0185* (2006.01)
*G06F 1/26* (2006.01)
(Continued)

(52) U.S. Cl.
CPC .......... *H03K 19/0185* (2013.01); *G06F 1/26* (2013.01); *H03K 19/0016* (2013.01); *H03K 19/017509* (2013.01); *H03K 19/0948* (2013.01)

(58) Field of Classification Search
CPC ....... H03K 19/0175; H03K 19/017509; H03K 19/0185; H03K 19/018507;
(Continued)

(56) References Cited

U.S. PATENT DOCUMENTS 6,567,067 B2 * 5/2003 Azami ............... H03K 19/0013
345/100
2002/0118159 A1 * 8/2002 Azami ........... H03K 19/018521
345/98
(Continued)

FOREIGN PATENT DOCUMENTS

CN        1407724 A    4/2003
CN      107800422 A    3/2018
(Continued)

*Primary Examiner* — Long Nguyen
(74) *Attorney, Agent, or Firm* — Chip Law Group

(57) ABSTRACT

A level shift circuit includes an input section to which input signal of a first power supply system is input, a supply section that includes a pair of nodes, and a regulator. The supply section is connected to one of a pair of power supply lines serving as a second power supply system of which a voltage level is higher than a voltage level of the first power supply system, the supply section supplying a potential of the one of the pair of power supply lines to one of the pair of nodes according to the input signal. The regulator is connected to another of the pair of power supply lines, the regulator regulating current flowing between the one of the pair of nodes that is supplied with the potential of the one of the pair of power supply lines, and the other of the pair of power supply lines.

17 Claims, 10 Drawing Sheets

(51) Int. Cl.
*H03K 19/00* (2006.01)
*H03K 19/0175* (2006.01)
*H03K 19/0948* (2006.01)

(58) Field of Classification Search
CPC ... H03K 19/018514; H03K 19/018521; H03K 19/01855; H03K 19/0016; H03K 19/0948; G06F 1/26
See application file for complete search history.

(56) References Cited

U.S. PATENT DOCUMENTS

| | | | |
|---|---|---|---|
| 2002/0140660 | A1 | 10/2002 | Sato et al. |
| 2003/0042965 | A1 | 3/2003 | Kanno et al. |
| 2018/0069537 | A1* | 3/2018 | Kamimaru ....... H03K 3/356113 |

FOREIGN PATENT DOCUMENTS

| | | |
|---|---|---|
| JP | 2000-10533 A | 1/2000 |
| JP | 2003-152096 A | 5/2003 |
| JP | 2015-192402 A | 11/2015 |
| JP | 2016-29863 A | 3/2016 |
| JP | 2018-042077 A | 3/2018 |
| KR | 10-2000-0006330 A | 1/2000 |
| KR | 10-2003-0019873 A | 3/2003 |
| KR | 10-2018-0028005 A | 3/2018 |

* cited by examiner

| XSD | LSIN | LSOUT | XLSOUT |
|---|---|---|---|
| 0 | * | 0 | 1 |
| 1 | 0 | 0 | 1 |
| 1 | 1 | 1 | 0 |

LEVEL SHIFT CIRCUIT AND ELECTRONIC APPARATUS

CROSS REFERENCE TO RELATED APPLICATIONS

This application is a U.S. National Phase of International Patent Application No. PCT/JP2019/043468 filed Nov. 6, 2019, which claims priority benefit of Japanese Patent Application No. JP 2018-213670 filed in the Japan Patent Office on Nov. 14, 2018. Each of the above-referenced applications is hereby incorporated herein by reference in its entirety.

TECHNICAL FIELD

The present technology relates to a level shift circuit and an electronic apparatus that convert the level of a signal.

BACKGROUND ART

In the past, a level shift circuit has been used as an interface between circuits that are driven by different power supply systems. For example, the level shift circuit converts a voltage level of a signal generated in a circuit on the input side into a voltage level of a power supply system used in a circuit on the output side, and outputs a signal obtained by the conversion.

Patent Literature 1 discloses a level shifter that converts the potential of an input signal from an LV potential that is a low potential to an HV potential that is a high potential. In the level shifter, an input signal is output from an LV circuit connected to an LV power supply line, and is supplied to an HV circuit connected to an HV power supply line. An output signal obtained by converting the potential of the input signal from an LV potential to an HV potential, is output from the HV circuit, and is supplied to a load circuit (for example, paragraphs [0019], [0025], [0026], and [0028] of the specification, and FIG. 2 in Patent Literature 1).

CITATION LIST

Patent Literature

Patent Literature 1: Japanese Patent Application Laid-open No. 2015-192402

DISCLOSURE OF INVENTION

Technical Problem

In recent years, a circuit and the like that operate with a lower power-supply voltage have been developed with developments in an integrated technology of a semiconductor circuit. Further, small devices such as a mobile device, a wearable device, and an Internet-of-Things (IoT) device have become widespread, and power consumption of the devices has been reduced. Thus, there is a need for a technology that makes it possible to convert the level of a signal with a low voltage while reducing power consumption.

In view of the circumstances descried above, an object of the present technology is to provide a level shift circuit and an electronic apparatus that are capable of converting the level of a signal with a low voltage while reducing power consumption.

Solution to Problem

In order to achieve the object described above, a level shift circuit according to an embodiment of the present technology includes an input section, a supply section, and a regulator.

An input signal of a first power supply system is input to the input section.

The supply section includes a pair of nodes, the supply section being connected to one of a pair of power supply lines serving as a second power supply system of which a voltage level is higher than a voltage level of the first power supply system, the supply section supplying a potential of the one of the pair of power supply lines to one of the pair of nodes according to the input signal.

The regulator is connected to another of the pair of power supply lines, the regulator regulating current flowing between the one of the pair of nodes that is supplied with the potential of the one of the pair of power supply lines, and the other of the pair of power supply lines.

In this level shift circuit, an input signal of the first power supply system is input. According to the input signal, one of a pair of nodes is supplied with a potential of one of a pair of power supply lines forming the second power supply system of which a voltage level is higher than a voltage level of the first power supply system. Further, current flowing between the node supplied with the potential of the one of the pair of power supply lines, and another of the pair of power supply lines is regulated. This makes it possible to easily supply the potential of the one of the pair of power supply lines included in the second power supply system even when, for example, the voltage level of the first power supply system is low, and thus to convert the level of a signal with a low voltage while reducing power consumption.

The pair of nodes may be an in-phase node and an anti-phase node, the in-phase node being supplied with a potential, the supply of the potential to the in-phase node being performed in a state of being in phase with the input signal, the anti-phase node being supplied with a potential, the supply of the potential to the anti-phase node being performed in a state of being in anti-phase with respect to the input signal. In this case, in the state of being in phase with the input signal, the regulator may regulate current flowing between the in-phase node and the other of the pair of power supply lines, and in the state of being in anti-phase with respect to the input signal, the regulator may regulate current flowing between the anti-phase node and the other of the pair of power supply lines.

The supply section may include a first MOS transistor and a second MOS transistor, the first MOS transistor including a drain connected to the in-phase node and a gate connected to the anti-phase node, the second MOS transistor including a drain connected to the anti-phase node and a gate connected to the in-phase node. In this case, the regulator may include a third MOS transistor and a fourth MOS transistor, the third MOS transistor being connected between a source of the first MOS transistor and the other of the pair of power supply lines, the fourth MOS transistor being connected between a source of the second MOS transistor and the other of the pair of power supply lines.

The first and second MOS transistors may be MOS transistors of a first type, the MOS transistor of the first type having a first withstand voltage corresponding to the voltage level of the second power supply system. In this case, the third and fourth MOS transistors may be MOS transistors of a second type, the MOS transistor of the second type having the first withstand voltage and of which a threshold voltage is set lower than a threshold voltage of the MOS transistor of the first type.

The input section may generate an in-phase signal in phase with the input signal, and an anti-phase signal in anti-phase with respect to the input signal. In this case, the first to fourth MOS transistors may be MOS transistors having the same polarity. Further, the anti-phase signal may be applied to a gate of the third MOS transistor. Furthermore, the in-phase signal may be applied to a gate of the fourth MOS transistor.

The supply section may include a first current-mirror circuit and a second current-mirror circuit, the first current-mirror circuit supplying current to the in-phase node, the second current-mirror circuit supplying current to the anti-phase node.

The first current-mirror circuit may include a first current path and a first switch section, the first current path being connected to the one of the pair of power supply lines, the first switch section being arranged in the first current path; and the first current-mirror circuit may replicate current flowing through the first current path to supply the in-phase node with current obtained by the replication. In this case, the second current-mirror circuit may include a second current path and a second switch section, the second current path being connected to the one of the pair of power supply lines, the second switch section being arranged in the second current path; and the second current-mirror circuit may replicate current flowing through the second current path to supply the anti-phase node with current obtained by the replication.

The input section may generate an in-phase signal in phase with the input signal, and an anti-phase signal in anti-phase with respect to the input signal. In this case, the first switch section may include a fifth MOS transistor that brings the first current path into conduction in response to the in-phase signal. Further, the second switch section may include a sixth MOS transistor that brings the second current path into conduction in response to the anti-phase signal.

The fifth and sixth MOS transistors may be MOS transistors of the second type. In this case, the in-phase signal may be applied to a gate of the fifth MOS transistor. Further, the anti-phase signal may be applied to a gate of the sixth MOS transistor.

The first switch section may include a seventh MOS transistor that interrupts the first current path in response to a potential of the anti-phase node. In this case, the second switch section may include an eighth MOS transistor that interrupts the second current path in response to a potential of the in-phase node.

The supply section may include a potential retaining circuit that retains the potential of the in-phase node on the basis of the potential of the anti-phase node, and retains the potential of the anti-phase node on the basis of the potential of the in-phase node.

The anti-phase signal may be applied to a source of the fifth MOS transistor. In this case, the in-phase signal may be applied to a source of the sixth MOS transistor.

The input section may include a MOS transistor of the second type and a MOS transistor of a third type, the MOS transistor of the third type having a second withstand voltage corresponding to the voltage level of the first power supply system.

The input section may include a first signal-generation circuit that generates an anti-phase signal in anti-phase with respect to the input signal, and an in-phase signal in phase with the input signal.

The one of the pair of power supply lines may be a power supply line situated on a high-potential side of the second power supply system. In this case, the first signal-generation circuit may include an nMOS transistor of the second type and a pMOS transistor of the third type, the nMOS transistor of the second type being connected on a low-potential side of the first power supply system, the pMOS transistor of the third type being connected on a high-potential side of the first power supply system.

The supply section may include a pair of current paths each connected to the input section and the one of the pair of power supply lines. In this case, the input section may include a second signal-generation circuit that generates the in-phase signal in phase with the input signal, and the anti-phase signal in anti-phase with respect to the input signal, the generation of the in-phase signal and the anti-phase signal being performed on the basis of output of the first signal-generation circuit, the anti-phase signal and the in-phase signal being input to the pair of current paths.

The one of the pair of power supply lines may be a power supply line situated on a high-potential side of the second power supply system. In this case, the second signal-generation circuit may include an nMOS transistor of the second type and an nMOS transistor of the third type, the nMOS transistor of the second type being connected on a low-potential side of the first power supply system, the nMOS transistor of the third type being connected on a high-potential side of the first power supply system.

The one of the pair of power supply lines may be a power supply line situated on a high-potential side of the second power supply system. In this case, the MOS transistor of the second type may be an nMOS transistor.

The one of the pair of power supply lines may be a power supply line situated on a low-potential side of the second power supply system. In this case, the MOS transistor of the second type may be a pMOS transistor.

An electronic apparatus, including:
a power supply section that includes a first power supply system, and a second power supply system of which a voltage level is higher than a voltage level of the first power supply system; and
a level shift circuit that includes
an input section to which an input signal of the first power supply system is input,
a supply section that includes a pair of nodes, the supply section being connected to one of a pair of power supply lines serving as the second power supply system, the supply section supplying a potential of the one of the pair of power supply lines to one of the pair of nodes according to the input signal, and
a regulator that is connected to another of the pair of power supply lines, the regulator regulating current flowing between the one of the pair of nodes that is supplied with the potential of the one of the pair of power supply lines, and the other of the pair of power supply lines.

MODE(S) FOR CARRYING OUT THE INVENTION

Embodiments according to the present technology will now be described below with reference to the drawings.

First Embodiment

[Configuration of Level Shift Circuit]

Figure 1:
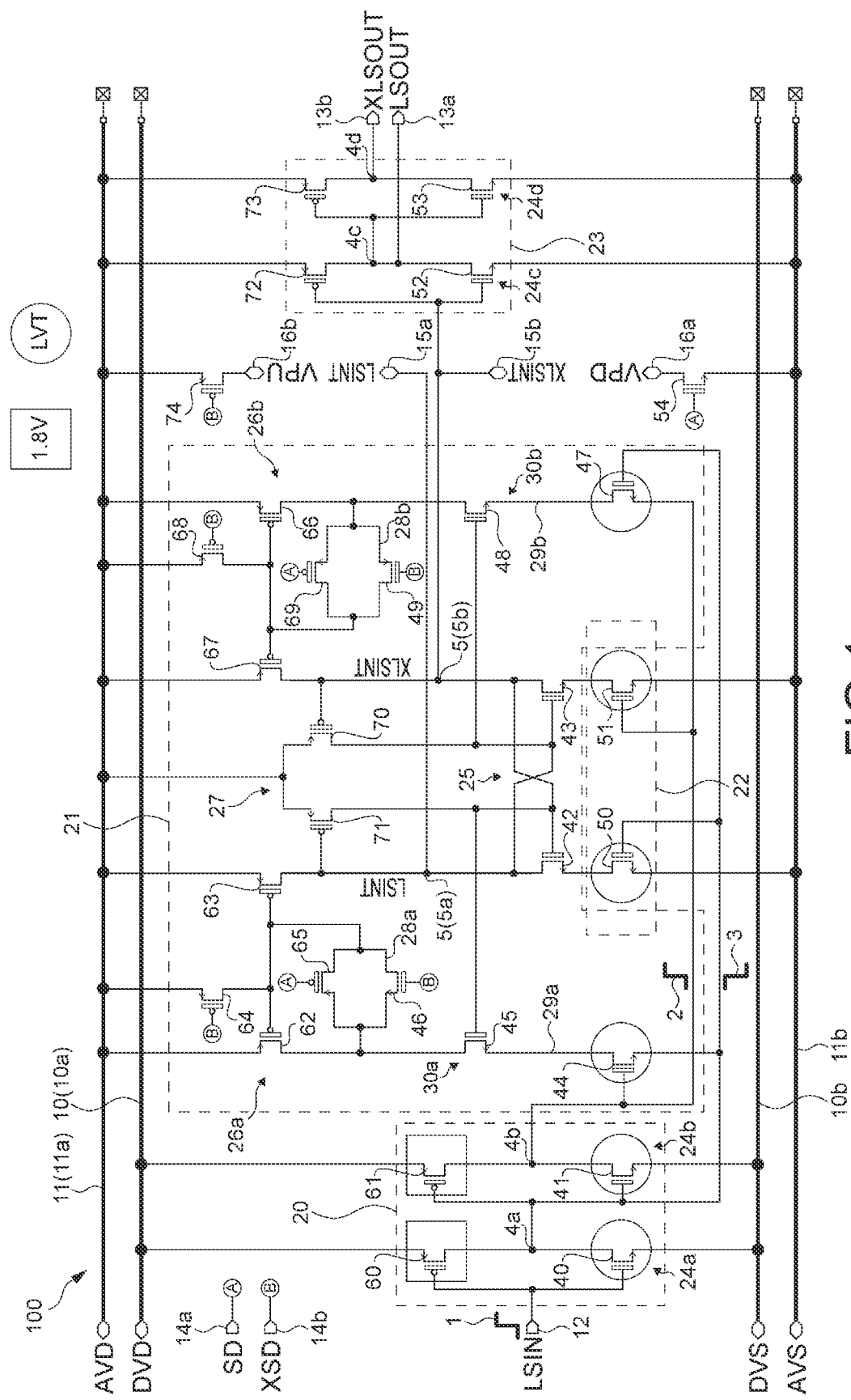
FIG. 1 is a circuit diagram illustrating an example of a configuration of a level shift circuit according to a first embodiment of the present technology.

FIG. 1 is a circuit diagram illustrating an example of a configuration of a level shift circuit according to a first embodiment of the present technology. A level shift circuit 100 is a circuit that converts the voltage level of an input signal, and outputs a signal obtained by the conversion. The input signal is a logic signal representing two logic levels using a difference in voltage value. For example, the logic level is represented by 0 when the voltage value of an input signal is small, and the logic level is represented by 1 when the voltage value of the input signal is large. Consequently, binarized digital data or the like that is represented by 0 and 1 is transmitted.

The voltage level of an input signal is, for example, a range of a voltage amplitude of a signal, and corresponds to a difference in a logic level (a voltage value) represented by 0 and 1. In the present embodiment, the level shift circuit 100 converts an input signal of which the voltage level is low (of which the voltage amplitude is low) is converted into a signal of which the voltage level is high (of which the voltage amplitude is high). Accordingly, for example, a signal generated in, for example, a logic circuit that operates with a low voltage can be input to a circuit that is situated on the output side and operates with a high voltage.

The level shift circuit 100 is used by being included in various electronic apparatuses such as computing apparatuses such as a personal computer (PC) and a server apparatus; mobile apparatuses such as a cellular phone, a smartphone, a tablet, a music player, and a digital camera; and wearable apparatuses such as a smart watch. The type and the like of the electronic apparatus in which the level shift circuit 100 is used are not limited.

As illustrated in FIG. 1, the level shift circuit 100 is connected to a DVD power supply 10 and to an AVD power supply 11. The AVD power supply 11 is a power supply of which a voltage level is higher than a voltage level of the DVD power supply 10. For example, a power supply section (not illustrated) that includes the DVD power supply 10 and the AVD power supply 11 is included in an electronic apparatus that includes the level shift circuit 100. The power supply section supplies power or the like of the DVD power supply 10 and the AVD power supply 11.

The DVD power supply 10 includes a DVD line 10a on the high-potential side and a DVS line 10b on the low-potential side. In other words, a potential difference between the DVD line 10a and the DVS line 10b corresponds to a power supply voltage of the DVD power supply 10. Note that the DVD power supply 10 also supplies power to, for example, a circuit on an input side of the level shift circuit 100.

In the present embodiment, an input signal generated by a circuit system (a DVD domain) driven by the DVD power supply 10 is input to the level shift circuit 100. Thus, the voltage level of the input signal corresponds to the power supply voltage of the DVD power supply 10. The power supply voltage of the DVD power supply 10 may be hereinafter referred to as an input-side voltage. In the present embodiment, the DVD power supply 10 corresponds to a first power supply system. Further, the DVD line 10a and DVS line 10b correspond to a pair of power supply lines serving as the first power supply system.

The AVD power supply 11 includes an AVD line 11a on the high-potential side and an AVS line 11b on the low-potential side. In other words, a potential difference between the AVD line 11a and the AVS line 11b corresponds to a power supply voltage of the AVD power supply 11. A circuit system driven by the AVD power supply 11 is hereinafter referred to as an AVD domain.

In the present embodiment, the voltage level of an input signal is converted by the level shift circuit 100 into a level of the power supply voltage of the AVD power supply 11. Thus, the voltage level of an output signal output from the level shift circuit 100 corresponds to the power supply voltage of the AVD power supply 11. The power supply voltage of the AVD power supply 11 may be hereinafter referred to as an output-side voltage. In the present embodiment, the AVD power supply 11 corresponds to a second power supply system. Further, the AVD line 11a and AVS line 11b correspond to a pair of power supply lines serving as the second power supply system.

Figure 2:
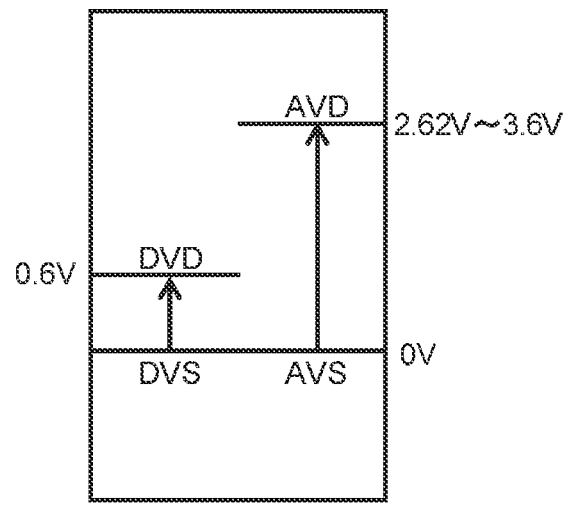
FIG. 2 schematically illustrates examples of power supply voltages of a DVD power supply and an AVD power supply.

FIG. 2 schematically illustrates examples of power supply voltages of the DVD power supply 10 and the AVD power supply 11. In the present embodiment, low-potential-side power supply lines (the DVS line 10b and the AVS line 11b) of the DVD power supply 10 and the AVD power supply 11 are set to have the same potential. The low-potential side of each power supply is typically connected to GND and set to 0 V. Thus, potentials of the DVD line 10a on the high potential-side and the AVD line 11a on the high potential-side respectively correspond to the input-side voltage and the output-side voltage.

The power supply voltage (the output-side voltage) of the AVD power supply 11 is set higher than the power supply voltage (the input-side voltage) of the DVD power supply 10. In the example illustrated in FIG. 2, the power supply voltage of the DVD power supply 10, that is, the potential of the DVD line 10a is set to 0.6 V. Further, the power supply voltage of the AVD power supply 11, that is, the potential of the AVD line 11a is set to about 2.6 V to 3.6 V. Of course, each power supply voltage is not limited thereto, and may be set as appropriate according to, for example, the use of the level shift circuit 100.

As illustrated in FIG. 1, the level shift circuit 100 includes an LSIN terminal 12, an LSOUT terminal 13a, an XLSOUT terminal 13b, an SD terminal 14a, an XSD terminal 14b, an LSINT terminal 15a, an XLSINT terminal 15b, a VPD terminal 16a, and a VPU terminal 16b.

The LSIN terminal 12 is a terminal to which an input signal is input. The LSOUT terminal 13a is a terminal from which an output signal is output. The XLSOUT terminal 13b is a terminal from which an inverted output signal is output. The SD terminal 14a, the XSD terminal 14b, the LSINT terminal 15a, the XLSINT terminal 15b, the VPD terminal 16a, and the VPU terminal 16b will be described later.

The level shift circuit 100 includes an input section 20, a potential supply section 21, a current regulator 22, and an output section 23. In the present embodiment, the potential supply section 21 corresponds to a supply section, and the current regulator 22 corresponds to a regulator.

The input section 20 is connected to a pair of power supply lines (the DVD line 10a and the DVS line 10b) serving as the DVD power supply 10. Further, the LSIN terminal 12 is connected to the input section 20, and an input signal of the DVD power supply 10 is input to the input section 20. Thus, the input section 20 is a DVD-domain circuit.

An in-phase signal in phase with an input signal and an anti-phase signal in anti-phase with respect to the input signal are generated by the input section 20. Both the in-phase signal and the anti-phase signal are signals that vibrate with a power supply voltage of the DVD power supply 10. Thus, the input signal, the in-phase signal, and the anti-phase signal are signals of the DVD power supply, and are signals of which the voltage levels are identical to each other. FIG. 1 schematically illustrates an input signal 1 exhibiting a rising waveform, an in-phase signal 2 in phase with the input signal 1, and an anti-phase signal 3 in anti-phase with respect to the input signal 1.

The in-phase signal 2 is, for example, a signal of which an amplitude is changed in phase (positive phase) with a change in an amplitude (a change in logic level) of the input signal 1, and is a signal that represents a logic level similar to a logic level of the input signal 1. In other words, the in-phase signal 2 can be said to be a signal substantially similar to the input signal 1. The in-phase signal 2 may also be referred to as a positive-phase signal.

The anti-phase signal 3 is, for example, a signal obtained by inverting the amplitude of the input signal 1. In other words, the anti-phase signal 3 is a signal obtained by performing inversion between amplitudes respectively representing a high level and a low level for the input signal 1. Thus, the logic level of the anti-phase signal 3 represents a logic level opposite to the logic level of the input signal 1, and is obtained by logically inverting the input signal 1. The anti-phase signal 3 may also be referred to as an inverted signal.

As illustrated in FIG. 1, the input section 20 includes a first inverter circuit 24a that outputs the anti-phase signal 3, and a second inverter circuit 24b that outputs the in-phase signal 2. The inverter circuits each include an n-channel metal-oxide semiconductor (MOS) transistor and a p-channel MOS transistor. In the present embodiment, the first inverter circuit 24a and the second inverter circuit 24b form a first signal-generation circuit that generates the anti-phase signal 3 in anti-phase with respect to the input signal 1, and the in-phase signal 2 in phase with the input signal 1.

Hereinafter, the n-channel MOS transistor is referred to as an nMOS transistor, and the p-channel MOS transistor is referred to as a pMOS transistor. In the present disclosure, of a pair of primary terminals of an nMOS transistor, a primary terminal connected on the high-potential side is referred to as a drain, and a terminal situated on the low-potential side is referred to as a source. Further, of a pair of primary terminals of a pMOS transistor, a terminal situated on the high-potential side is referred to as a source, and a terminal situated on the low-potential side is referred to as a drain. Note that FIG. 1 illustrates an example of a connection of a back gate of each MOS transistor.

The first inverter circuit 24a includes an nMOS transistor 40 and a pMOS transistor 60 that are connected to each other through an intermediate node 4a. A gate of the nMOS transistor 40 is connected to the LSIN terminal 12, a source of the nMOS transistor 40 is connected to the DVS line 10b, and a drain of the nMOS transistor 40 is connected to the intermediate node 4a. A gate of the pMOS transistor 60 is connected to the LSIN terminal 12, a source of the pMOS transistor 60 is connected to the DVD line 10a, and a drain of the pMOS transistor 60 is connected to the intermediate node 4a.

The second inverter circuit 24b includes an nMOS transistor 41 and a pMOS transistor 61 that are connected to each other through an intermediate node 4b. A gate of the nMOS transistor 41 is connected to the intermediate node 4a, a source of the nMOS transistor 41 is connected to the DVS line 10b, and a drain of the nMOS transistor 41 is connected to the intermediate node 4b. A gate of the pMOS transistor 61 is connected to the intermediate node 4a, a source of the pMOS transistor 61 is connected to the DVD line 10a, and a drain of the pMOS transistor 61 is connected to the intermediate node 4b.

For example, the first inverter circuit 24a logically inverts the input signal 1 input from the LSIN terminal 12, and outputs the anti-phase signal 3 via the intermediate node 4a. Further, the second inverter circuit 24b logically inverts the anti-phase signal 3 input from the first inverter circuit 24a (the intermediate node 4a), and outputs the in-phase signal 2 via the intermediate node 4b.

The potential supply section 21 is connected to one of a pair of power supply lines (the AVD line 11a and the AVS line 11b) serving as the AVD power supply 11 of which a voltage level is higher than a voltage level of the DVD power supply 10. In the present embodiment, one of the pair of power supply lines is a power supply line on the high-potential side of the AVD power supply 11. In other words, the potential supply section 21 is connected to the AVD line 11a on the high-potential side of the AVD power supply 11. Note that another of the pair of power supply lines is a power supply line on the low-potential side of the AVD power supply 11 (the AVS line 11b).

The potential supply section 21 includes a pair of nodes 5, a cross-coupled circuit 25, a first current-mirror circuit 26a, a second current-mirror circuit 26b, and a potential retaining circuit 27.

The pair of nodes 5 is nodes used when the potential supply section performs outputting, and is connected to the output section 23 described later. The pair of nodes 5 is an in-phase node 5a and an anti-phase node 5b, the in-phase node 5a being supplied with a potential, the supply of the potential to the in-phase node 5a being performed in a state of being in phase with the input signal 1, the anti-phase node 5b being supplied with a potential, the supply of the potential to the anti-phase node 5b being performed in a state of being in anti-phase with respect to the input signal 1.

The potential of the AVD line 11a is supplied to the in-phase node 5a in phase (positive phase) with the input signal 1. For example, when the input signal 1 is at a high level, the potential of the AVD line 11a on the high-potential side is supplied to the in-phase node 5a. Further, when the input signal 1 is at a low level, a potential (a GND potential) of the AVS line 11b on the low-potential side is supplied to the in-phase node 5a.

The potential of the AVD line 11a is supplied to the anti-phase node 5b in anti-phase (negative phase) with respect to the input signal 1. For example, when the input signal 1 is at a high level, the potential (the GND potential) of the AVS line 11b on the low-potential side is supplied to the anti-phase node 5b. Further, when the input signal 1 is at a low level, the potential of the AVD line 11a on the high-potential side is supplied to the anti-phase node 5b.

As described above, the potential supply section 21 supplies the potential of the AVD line 11a to one of the pair of nodes 5 according to the input signal 1. An operation of supplying a potential to the pair of nodes 5 (the in-phase node 5a and the anti-phase node 5b) will be described in detail later.

The cross-coupled circuit 25 includes an nMOS transistor 42 and an nMOS transistor 43. A drain of the nMOS transistor 42 is connected to the in-phase node 5a, and a gate of the nMOS transistor 42 is connected to the anti-phase node 5b. Further, a drain of the nMOS transistor 43 is connected to the anti-phase node 5b, and a gate of the nMOS transistor 43 is connected to the in-phase node 5a. Note that sources of the nMOS transistors 42 and 43 are each connected to the current regulator 22 described later.

As described above, the nMOS transistors 42 and 43 form a cross-coupled circuit in which a gate of one of the nMOS transistors is connected to a drain of another of the nMOS transistors and a drain of the one of the nMOS transistors is connected to a gate of the other of the nMOS transistors. In the present embodiment, the nMOS transistor 42 corresponds to a first MOS transistor, and the nMOS transistor 43 corresponds to a second MOS transistor.

The first current-mirror circuit 26a supplies current to the in-phase node 5a. The first current-mirror circuit 26a includes pMOS transistors 62 and 63 and nMOS transistors 44 and 45. Further, the first current-mirror circuit 26a includes a transmission gate 28a and a pMOS transistor 64.

A source of the pMOS transistor 62 is connected to the AVD line 11a. Further, a drain of the pMOS transistor 62 is connected to its own gate through the transmission gate 28a. Thus, the pMOS transistor 62 is a pMOS transistor diode-connected through the transmission gate 28a.

A source of the pMOS transistor 63 is connected to the AVD line 11a, a drain of the pMOS transistor 63 is connected to the in-phase node 5a, and a gate of the pMOS transistor 63 is connected to a gate of the pMOS transistor 62. Accordingly, a current-mirror circuit is formed that uses the AVD line 11a as a current source. For example, the pMOS transistors 62 and 63 are designed using similar design values (such as a gate length and a gate width).

A source of the nMOS transistor 44 is connected to the intermediate node 4a of the first inverter circuit 24a, and a gate of the nMOS transistor 44 is connected to the intermediate node 4b of the second inverter circuit 24b. A source of the nMOS transistor 45 is connected to a drain of the nMOS transistor 44, and a gate of the nMOS transistor 45 is connected to the anti-phase node 5b. Further, a drain of the nMOS transistor 45 is connected to the drain of the pMOS transistor 62.

The transmission gate 28a includes an nMOS transistor 46 and a pMOS transistor 65 that are situated between the drain and the gate of the pMOS transistor 62, and are connected in parallel to each other. A gate of the nMOS transistor 46 and a gate of the pMOS transistor 65 are respectively connected to the XSD terminal 14b and the SD terminal 14a. Note that, in FIG. 1, a circled letter A represents connection with the SD terminal 14a, and a circled letter B represents connection with the XSD terminal 14b.

A source of the pMOS transistor 64 is connected to the AVD line 11a, a drain of the pMOS transistor 64 is connected to the gate of the pMOS transistor 62, and a gate of the pMOS transistor 64 is connected to the XSD terminal 14b. For example, the transmission gate 28a and the pMOS transistor 64 are used to set an output initial value of the level shift circuit 100. During a normal operation, the transmission gate 28a is in an on state, and the pMOS transistor 64 is in an off state.

As illustrated in FIG. 1, the nMOS transistor 44, the nMOS transistor 45, and the pMOS transistor 62 are connected in series in this order. Accordingly, a first current path 29a is formed that connects the intermediate node 4a of the first inverter circuit 24a and the AVD line 11a. Further, the two nMOS transistors 44 and 45 serve as a first switch section 30a used to bring the first current path 29a into conduction and to interrupt the first current path 29a.

As described above, the first current-mirror circuit 26a includes the first current path 29a connected to the AVD line 11a, and the first switch section 30a arranged in the first current path 29a. For example, when current flows through the first current path 29a, similar current flows between the source and the drain of the pMOS transistor 63. In other words, the first current-mirror circuit 26a replicates the current flowing through the first current path 29a to supply the in-phase node 5a with current obtained by the replication. Further, bringing the first current path 29a into conduction and interrupting the first current path 29a are controlled by the nMOS transistors 44 and 45. In the present embodiment, the nMOS transistor 44 corresponds to a fifth MOS transistor, and the nMOS transistor 45 corresponds to a seventh MOS transistor.

The second current-mirror circuit 26b supplies current to the anti-phase node 5b. The second current-mirror circuit 26b includes pMOS transistors 66 and 67 and nMOS transistors 47 and 48. Further, the second current-mirror circuit 26b includes a transmission gate 28b and a pMOS transistor 68. The first and second current-mirror circuits 26a and 26b are configured to be driven at a timing of being in anti-phase with respect to each other.

A source of the pMOS transistors 66 is connected to the AVD line 11a. Further, a drain of the pMOS transistor 66 is connected to its own gate through the transmission gate 28b. Thus, the pMOS transistor 66 is a pMOS transistor diode-connected through the transmission gate 28b.

A source of the pMOS transistor 67 is connected to the AVD line 11a, a drain of the pMOS transistor 67 is connected to the anti-phase node 5b, and a gate of the pMOS transistor 67 is connected to a gate of the pMOS transistor 66. Accordingly, a current-mirror circuit is formed that uses the AVD line 11a as a current source. For example, the pMOS transistors 66 and 67 are designed using similar design values (such as a gate length and a gate width).

A source of the nMOS transistor 47 is connected to the intermediate node 4b of the second inverter circuit 24b, and a gate of the nMOS transistor 47 is connected to the intermediate node 4a of the first inverter circuit 24a. A source of the nMOS transistor 48 is connected to a drain of the nMOS transistor 47, and a gate of the nMOS transistor 48 is connected to the in-phase node 5a. Further, a drain of the nMOS transistor 48 is connected to the drain of the pMOS transistor 66.

The transmission gate 28b includes an nMOS transistor 49 and a pMOS transistor 69 that are situated between the drain and the gate of the pMOS transistor 66, and are connected in parallel to each other. A gate of the nMOS transistor 49 and a gate of the pMOS transistor 69 are respectively connected to the XSD terminal 14b and the SD terminal 14a.

A source of the pMOS transistor 68 is connected to the AVD line 11a, a drain of the pMOS transistor 68 is connected to the gate of the pMOS transistor 66, and a gate of the pMOS transistor 68 is connected to the XSD terminal 14b. For example, the transmission gate 28b and the pMOS transistor 68 are used to set the output initial value of the level shift circuit 100. During a normal operation, the transmission gate 28b is in an on state, and the pMOS transistor 68 is in an off state.

As illustrated in FIG. 1, the nMOS transistor 47, the nMOS transistor 48, and the pMOS transistor 66 are connected in series in this order. Accordingly, a second current path 29b is formed that connects the intermediate node 4b of the second inverter circuit 24b and the AVD line 11a. Further, the two nMOS transistors 47 and 48 serve as a second switch section 30b used to bring the second current path 29b into conduction and to interrupt the second current path 29b.

As described above, the second current-mirror circuit 26b includes the second current path 29b connected to the AVD line 11a, and the second switch section 30b arranged in the second current path 29b. For example, when current flows through the second current path 29b, similar current flows between the source and the drain of the pMOS transistor 67. In other words, the second current-mirror circuit 26b replicates the current flowing through the second current path 29b to supply the anti-phase node 5b with current obtained by the replication. Further, bringing the second current path 29b into conduction and interrupting the second current path 29b are controlled by the nMOS transistors 47 and 48. In the present embodiment, the nMOS transistor 47 corresponds to a sixth MOS transistor, and the nMOS transistor 48 corresponds to an eighth MOS transistor.

The potential retaining circuit 27 is a circuit that retains potentials of the in-phase node 5a and the anti-phase node 5b. The potential retaining circuit 27 includes a pMOS transistor 70 and a pMOS transistor 71.

A source of the pMOS transistor 70 is connected to the AVD line 11a, and a drain of the pMOS transistor 70 is connected to the in-phase node 5a (the gate of the nMOS transistor 43 of the cross-coupled circuit 25). Further, a gate of the pMOS transistor 70 is connected to the anti-phase node 5b. A source of the pMOS transistor 71 is connected to the AVD line 11a, and a drain of the pMOS transistor 71 is connected to the anti-phase node 5b (the gate of the nMOS transistor 42 of the cross-coupled circuit 25). Further, a gate of the pMOS transistor 71 is connected to the in-phase node 5a.

The current regulator 22 is connected to the potential supply section 21 and to the AVS line 11b on the low-potential side of the AVD power supply 11, and regulates current flowing between the pair of nodes 5 (the in-phase node 5a and the anti-phase node 5b) and the AVS line 11b. The current regulator 22 includes an nMOS transistor 50 and an nMOS transistor 51.

The nMOS transistor 50 regulates current flowing between the in-phase node 5a and the AVS line 11b. A drain of the nMOS transistor 50 is connected to the source of the nMOS transistor 42 of the cross-coupled circuit 25, and a source of the nMOS transistor 50 is connected to the AVS line 11b. As described above, the nMOS transistor 50 is connected between the source of the nMOS transistor 42 and the AVS line 11b. Further, a gate of the nMOS transistor 50 is connected to an output (the intermediate node 4a) of the first inverter circuit 24a. In the present embodiment, the nMOS transistor 50 corresponds to a third MOS transistor.

The nMOS transistor 51 regulates current flowing between the anti-phase node 5b and the AVS line 11b. A drain of the nMOS transistor 51 is connected to the source of the nMOS transistor 43 of the cross-coupled circuit 25, and a source of the nMOS transistor 51 is connected to the AVS line 11b. As described above, the nMOS transistor 51 is connected between the source of the nMOS transistor 43 and the AVS line 11b. Further, a gate of the nMOS transistor 51 is connected to an output (the intermediate node 4b) of the second inverter circuit 24b. In the present embodiment, the nMOS transistor 51 corresponds to a fourth MOS transistor.

As described above, in the present embodiment, the cross-coupled circuit 25 and the current regulator 22 are arranged between the pair of nodes 5 and the AVS line 11b. Further, all of the nMOS transistors 42, 43, 50, and 51 included in the cross-coupled circuit 25 or the current regulator 22 are n-channel MOS transistors having the same polarity.

The output section 23 generates an output signal of a voltage level of the AVD power supply 11 on the basis of potentials of the pair of nodes 5. The output section 23 includes a third inverter circuit 24c and a fourth inverter circuit 24d.

The third inverter circuit 24c includes an nMOS transistor 52 and a pMOS transistor 72 that are connected to each other through an intermediate node 4c. A gate of the nMOS transistor 52 is connected to the anti-phase node 5b, a source of the nMOS transistor 52 is connected to the AVS line 11b, and a drain of the nMOS transistor 52 is connected to the intermediate node 4c. A gate of the pMOS transistor 72 is connected to the anti-phase node 5b, a source of the pMOS transistor 72 is connected to the AVD line 11a, and a drain of the pMOS transistor 72 is connected to the intermediate node 4c. Further, the intermediate node 4c is connected to the LSOUT terminal 13a.

The fourth inverter circuit 24d includes an nMOS transistor 53 and a pMOS transistor 73 that are connected to each other through an intermediate node 4d. A gate of the nMOS transistor 53 is connected to the intermediate node 4c, a source of the nMOS transistor 53 is connected to the AVS line 11b, and a drain of the nMOS transistor 53 is connected to the intermediate node 4d. A gate of the pMOS transistor 73 is connected to the intermediate node 4c, a source of the pMOS transistor 73 is connected to the AVD line 11a, and a drain of the pMOS transistor 73 is connected to the intermediate node 4c. Further, the intermediate node 4d is connected to the XLSOUT terminal 13b.

Further, the level shift circuit 100 includes an nMOS transistor 54 that is connected between the VPD terminal 16a and the AVS line 11b, and a pMOS transistor 74 that is connected between the VPU terminal 16b and the AVD line 11a. The SD terminal 14a and the XSD terminal 14b are respectively connected to a gate of the nMOS transistor 54 and a gate of the pMOS transistor 74.

The SD terminal 14a and the XSD terminal 14b are terminals used to switch between a standby state and an active state of the level shift circuit 100. A control signal of a voltage level of the AVD power supply 11 is input to the SD terminal 14a, and an anti-phase signal (an inverted signal) obtained by logically inverting the control signal is input to the XSD terminal 14b. In the present embodiment, the level shift circuit 100 is in the standby state when the SD terminal 14a is at a high level (the XSD terminal 14b is at a low level). Further, the level shift circuit 100 is in the active state when the SD terminal 14a is at a low level (the XSD terminal 14b is at a high level).

Four terminals that are the LSINT terminal 15a, the XLSINT terminal 15b, the VPD terminal 16a, and the VPU terminal 16b are terminals used to set the output initial value of the level shift circuit 100 in the standby state. The LSINT terminal 15a is connected to the in-phase node 5a. The XLSINT terminal 15b is connected to the anti-phase node 5b. Further, as described above, the VPD terminal 16a is connected to the AVS line 11b through the nMOS transistor 54, and the VPU terminal 16b is connected to the AVD line 11a through the nMOS transistor 74.

Figure 3:
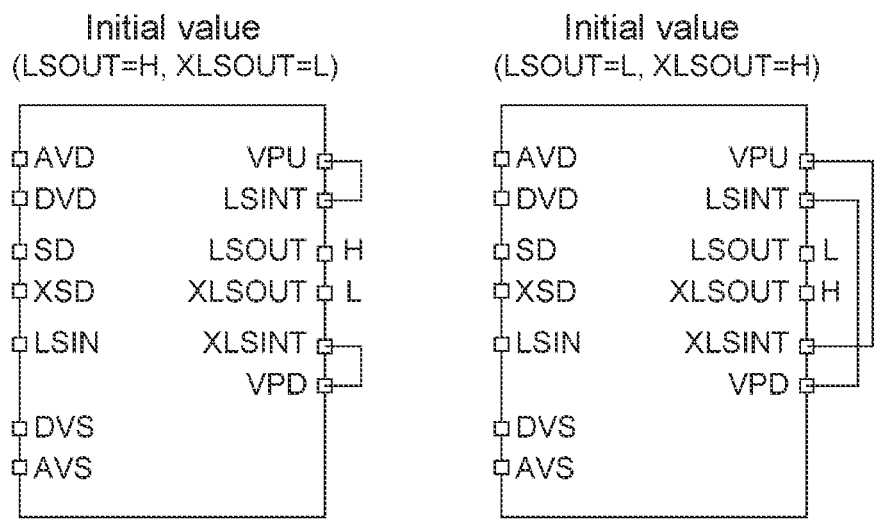
FIG. 3 schematically illustrates an example of wiring when an output initial value is set.

FIG. 3 schematically illustrates an example of wiring when an output initial value is set. The output initial value represents, for example, a voltage level of an output terminal (the LSOUT terminal 13a and the XLSOUT terminal 13b) at a timing at which the level shift circuit 100 is switched to the active state. In the level shift circuit 100, the LSINT terminal 15a is connected to one of the VPU terminal 16b and the VPD terminal 16a, and the XLSINT terminal 15b is connected to another of the VPU terminal 16b and the VPD terminal 16a and the XLSINT terminal 15b to set the output initial value.

In a right portion of FIG. 3, the LSINT terminal 15a is connected to the VPU terminal 16b, and the XLSINT terminal 15b is connected to the VPD terminal 16a. Consequently, an output initial value (LSOUT=H, XLSOUT=L) in which the LSOUT terminal 13a is at a high level, and the XLSOUT terminal 13b is at a low level, is set. Further, in a right portion of FIG. 3, the LSINT terminal 15a is connected to the VPD terminal 16a, and the XLSINT terminal 15b is connected to the VPU terminal 16b. Consequently, an output initial value (LSOUT=L, XLSOUT=H) in which the LSOUT terminal 13a is at a low level, and the XLSOUT terminal 13b is at a high level, is set. Note that an operation and the like when the output initial value is set will be described in detail later.

Switching with respect to connection between the LSINT and XLSINT terminals 15a and 15b, and the VPU and VPD terminals 16b and 16a is performed using, for example, a single switch circuit (not illustrated). For example, a plurality of level shift circuits 100 is connected to the switch circuit. This makes it possible to easily set output initial values of the plurality of level shift circuits 100 by only changing wiring of the switch circuit provided in a higher layer.

[Type of MOS Transistor]

The types of, for example, a withstand voltage and a threshold voltage of a MOS transistor used in the level shift circuit 100 are described below. Here, the withstand voltage of a MOS transistor is represented by, for example, a largest value of a voltage that can be applied in a range in which the MOS transistor operates properly. The withstand voltage is represented by a voltage value applied for, for example, between the gate and the source, between the gate and the drain, between the gate and the bulk, between the source and the drain, between the source and the bulk, and between the drain and the bulk.

In general, a gate insulation film of a MOS transistor of which a withstand voltage is low is thin. For example, a MOS transistor of which a gate insulation film is sufficiently thin exhibits a high performance in causing current to flow between the source and the drain. On the other hand, for example, a leakage current (Ioff) flowing between the source and the drain is increased in an off state when the gate insulation film is thin. Further, there is a reduction in a withstand-voltage performance of an element due to a gate insulation film being thin.

Examples of a MOS transistor included in, for example, an integrated circuit include a MOS transistor (a 3.3-V Tr) of which a withstand voltage is 3.3 V, a MOS transistor (a 2.5-V Tr) of which a withstand voltage is 2.5 V, a MOS transistor (a 1.8-V Tr) of which a withstand voltage is 1.8 V, and a MOS transistor (a 0.7-V Tr) of which a withstand voltage is 0.7 V.

Figure 8:
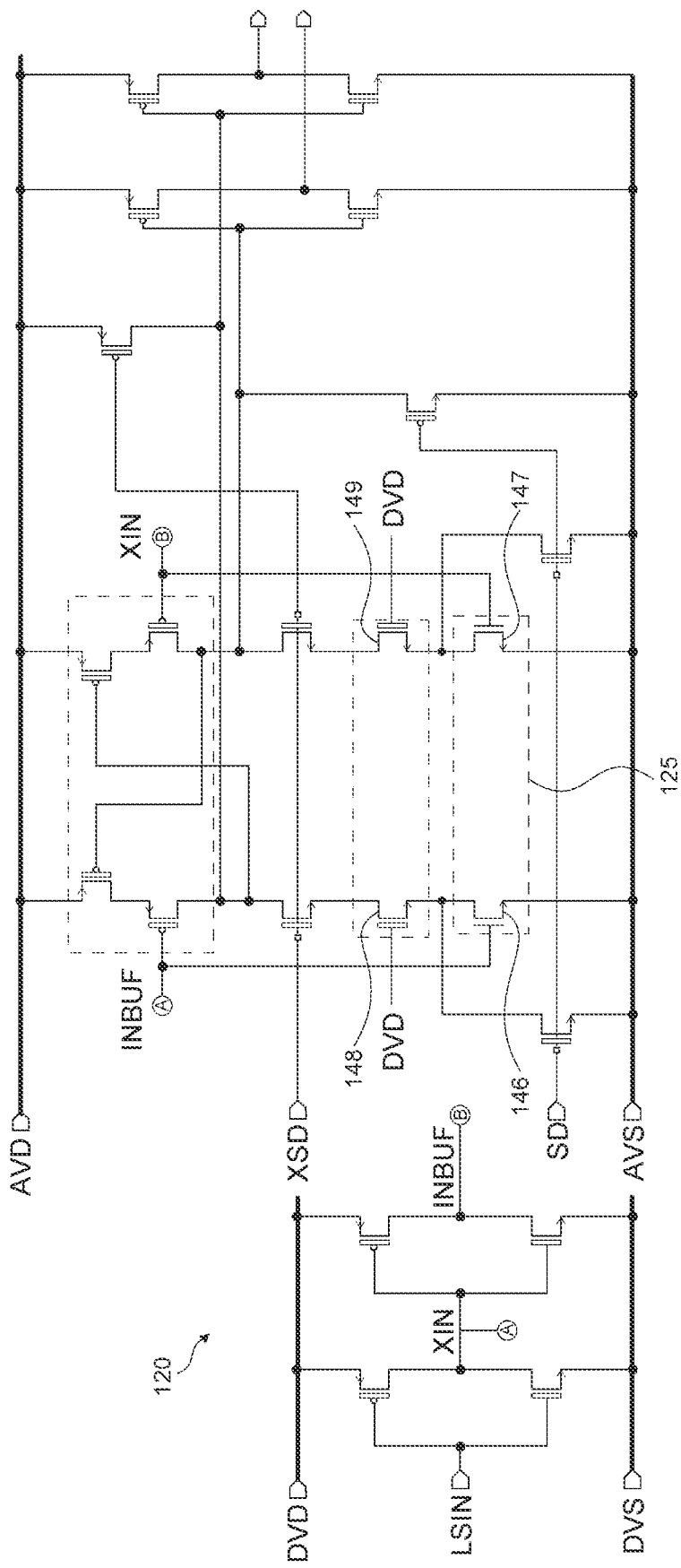
FIG. 8 is a circuit diagram of a level shift circuit of a comparative example.

From among those MOS transistors, the 0.7-V Tr is a MOS transistor of which a gate insulation film is made sufficiently thin, and there is a need to, for example, take sufficient withstand-voltage measures when, for example, the 0.7-V Tr is used at a power supply voltage of about 3 V, such as a power supply voltage of the AVD power supply 11 (refer to, for example, FIG. 8). On the other hand, the 1.8-V Tr, the 2.5-V Tr, the 3.3-V Tr, and the like can be said to be MOS transistors of which a gate insulation film is sufficiently thick.

In the present disclosure, a MOS transistor, such as a 0.7-V Tr, of which a withstand voltage is not greater than 0.7 V is referred to as a thin film Tr. Further, a MOS transistor, such as a 1.8-V Tr, a 2.5-V Tr, and a 3.3-V Tr, of which a withstand voltage is greater than 0.7 V is referred to as a thick film transistor Tr. Note that a withstand voltage value and the like that are used to distinguish the thin film Tr and the thick film Tr are not limited. For example, the withstand voltage value and the like that are used to distinguish the thin film Tr and the thick film Tr may be set as appropriate according to a power supply voltage or the like used in the level shift circuit 100.

Further, for example, it is possible to set a threshold voltage to a desired value while maintaining a withstand voltage, by a MOS transistor being configured as appropriate. This makes it possible to implement, for example, nMOS transistors and pMOS transistors of which withstand voltages are the same and of which threshold voltages are different.

For example, a MOS transistor having a standard threshold voltage (standard Vth: SVT), and a MOS transistor having a low threshold voltage (low Vth: LVT) lower than SVT are used in an integrated circuit. For example, an nMOS transistor (or a pMOS transistor) of LVT is driven with a threshold voltage sufficiently lower than an nMOS transistor (or a pMOS transistor) of SVT even when their withstand voltages are the same. Note that LVT may also be referred to as an ultralow Vth (ULVT) according to the value of a threshold voltage. The value of LVT or ULVT is not limited, and, for example, any threshold voltage lower than SVT may be set.

For example, a plurality of MOS transistors included in the level shift circuit 100 can be broadly classified into three types on the basis of the withstand voltage and the threshold voltage described above. A MOS transistor of a first type is a MOS transistor that has a withstand voltage for AVD domain. A MOS transistor of a second type is a MOS transistor that has a withstand voltage for AVD domain and of which a threshold voltage is set lower than a threshold voltage of the MOS transistor of the first type. A MOS transistor of a third type is a MOS transistor that has a withstand voltage for DVD domain.

In the circuit diagram illustrated in FIG. 1, a circled MOS transistor is a MOS transistor of the second type, and a boxed MOS transistor is a MOS transistor of the third type. All of the other MOS transistors are MOS transistors of the first type.

As illustrated in FIG. 1, the nMOS transistors 42 and 43 forming the cross-coupled circuit 25 are MOS transistors of the first type, the MOS transistor of the first type having a first withstand voltage corresponding to a voltage level of the AVD power supply 11. Here, the first withstand voltage corresponding to a voltage level of the AVD power supply 11 is typically a withstand voltage that makes it possible to properly perform an operation at the voltage level of the AVD power supply 11. In the present embodiment, the first withstand voltage is set to, for example, 3.3 V.

Further, the threshold voltage of a MOS transistor of the first type is set to, for example, a standard threshold voltage (SVT) corresponding to the first withstand voltage. Thus, in the present embodiment, the MOS transistor of the first type is a MOS transistor (3.3V-SVT-Tr) that has a withstand voltage of 3.3 V and of which a threshold voltage is SVT. Note that values and the like of the first withstand voltage and SVT are not limited, and, for example, may be set as appropriate in a range in which an operation in the AVD domain can be performed.

Further, as described above, all of the MOS transistors other than a MOS transistor of the second type (a circled MOS transistor) and a MOS transistor of the third type (a boxed MOS transistor) are MOS transistors of the first type. Thus, as illustrated in FIG. 1, the nMOS transistors 45, 46, 48, 49, 52, 53, and 54 are nMOS transistors of the first type. Further, the pMOS transistors 62 to 74 are pMOS transistors of the first type. As described above, the MOS transistor of the first type includes both an nMOS transistor and a pMOS transistor that each have the first withstand voltage.

As illustrated in FIG. 1, the nMOS transistors 50 and 51 forming the current regulator 22 are nMOS transistors of the second type, the nMOS transistor of the second type having the first withstand voltage and of which a threshold voltage is set lower than a threshold voltage of a MOS transistor of the first type. In the present embodiment, the MOS transistor of the second type is a MOS transistor of which a threshold voltage is lower than a threshold voltage of the above-described nMOS transistor of the first type (for example, the nMOS transistor 42).

The threshold voltage of a MOS transistor of the second type is, for example, a low threshold voltage (LVT) at the first withstand voltage. Thus, in the present embodiment, the MOS transistor of the second type is a MOS transistor (3.3V-LVT-Tr) that has a withstand voltage of 3.3 V and of which a threshold voltage is LVT. For example, LVT is set as appropriate in a range in which a gate control and the like can be performed by a signal (such as the in-phase signal 2 and the anti-phase signal 3) of a voltage level of the DVD power supply 10.

Further, as illustrated in FIG. 1, the nMOS transistors 44 and 47 of the potential supply section 21 are MOS transistors of the second type. Further, the nMOS transistors 40 and 41 of the input section 20 are MOS transistors of the second type. As described above, in the present embodiment, the MOS transistor of the second type is an nMOS transistor, and is arranged at six points in the level shift circuit 100.

Further, the pMOS transistors 60 and 61 included in the input section 20 are MOS transistors of the third type that each have a second withstand voltage corresponding to a voltage level of the DVD power supply 10. Here, the second withstand voltage corresponding to a voltage level of the DVD power supply 10 is typically a withstand voltage that makes it possible to properly perform an operation at the voltage level of the DVD power supply 10. In the present embodiment, the second withstand voltage is set to, for example, 1.8 V.

Further, the threshold voltage of a MOS transistor of the third type is set to, for example, a standard threshold voltage (SVT) corresponding to the second withstand voltage. Thus, in the present embodiment, the MOS transistor of the third type is a MOS transistor (1.8V-SVT-Tr) that has a withstand voltage of 1.8 V and of which the threshold voltage is SVT. Note that values and the like of the second withstand voltage and SVT are not limited, and, for example, may be set as appropriate in a range in which an operation in the DVD domain can be performed.

As described above, the first inverter circuit 24 and the second inverter circuit 24 (the first signal-generation circuit) that form the input section 20 each include an nMOS transistor of the second type that is connected to the DVD power supply 10 on the low-potential side, and a pMOS transistor of the third type that is connected to the DVD power supply 10 on the high-potential side.

[Setting of Output Initial Value]

Figures 4, 5:
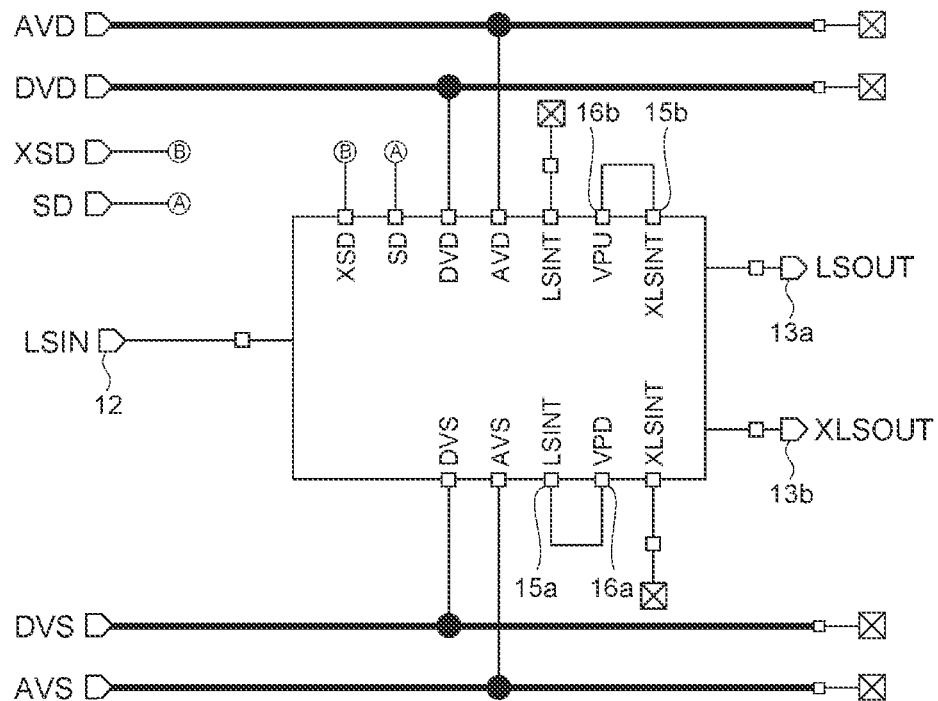
FIG. 4 schematically illustrates an example of a schematic configuration of the level shift circuit.
FIG. 5 is a truth table related to input and output of the level shift circuit.

FIG. 4 schematically illustrates an example of a schematic configuration of the level shift circuit 100. FIG. 4 schematically illustrates the level shift circuit 100 of FIG. 1 in the form of a block that includes a plurality of terminals. The level shift circuit 100 can be said to be a circuit that is connected to the DVD power supply 10 and the AVD power supply 11, as illustrated in FIG. 4, and converts the level of a signal input from the LSIN terminal 12 to output an obtained signal from the LSOUT terminal 13a and the XLSOUT terminal 13b.

Further, in FIG. 4, the LSINT terminal 15a and the VPD terminal 16a are connected to each other, and the XLSINT terminal 15b and the VPU terminal 16b are connected to each other. Thus, in FIG. 4, setting is performed such that the output initial value for the LSOUT terminal 13a corresponds to a low level, and the output initial value for the XLSOUT terminal 13b corresponds to a high level, as in the right portion of FIG. 3.

In the following description, it is assumed that the output initial value is set to (LSOUT=L, XLSOUT=H). Of course, the present technology is also applicable when the output initial value is set to (LSOUT=H, XLSOUT=L).

The setting of an output initial value is performed in the standby state, as described above. In the standby state, the SD terminal 14a is set at a high level, and the XSD terminal 14b is set at a low level. In other words, the same potential as the AVD line 11a is set for the SD terminal 14a, and the same potential as the AVS line 11b is set for the XSD terminal 14b.

Consequently, in the standby state, the transmission gate 28a is turned off, and a diode connection of the pMOS transistor 62 is cut off. Further, the pMOS transistor 64 is turned on, and potentials of the gates of the PMOS transistors 62 and 63 go up to the potential of the AVD line 11a to cut off current flowing through the first current-mirror circuit 26a.

Similarly, the transmission gate 28b is turned off, and a diode connection of the pMOS transistor 66 is cut off. Further, the pMOS transistor 68 is turned on, and the gates of the PMOS transistors 66 and 67 go up to the potential of the AVD line 11a to cut off current flowing through the second current-mirror circuit 26b.

Further, in the standby state, "XSD=L" is applied to the gate of the pMOS transistor 74, and the pMOS transistor 74 is turned on. Consequently, the VPU terminal 16b goes to a high level to have the same potential as the AVD line 11a. Further, "SD=H" is applied to the gate of the nMOS transistor 54, and the nMOS transistor 54 is turned on. Consequently, the VPD terminal 16a goes to a low level to have the same potential as the AVS line 11b.

The LSINT terminal 15a is at a low level since the LSINT terminal 15a is connected to the VPD terminal 16a. On the other hand, the XLSINT terminal 15b is at a high level since the XLSINT terminal 15b is connected to the VPU terminal 16b. The potential of the XLSINT terminal 15b (the anti-phase node 5b) is supplied to the output section 23.

In the output section 23, the potential of the XLSINT terminal 15b is inverted to be output to the LSOUT terminal 13a by the third inverter circuit 24. Further, the potential of the LSOUT terminal 13a is inverted to be output to the XLSOUT terminal 13b by the fourth inverter circuit 24. Consequently, the LSOUT terminal 13a goes to a low level, and the XLSOUT terminal 13b goes to a high level. Accordingly, the initial output value of (LSOUT=L, XLSOUT=H) is set.

Figure 6:
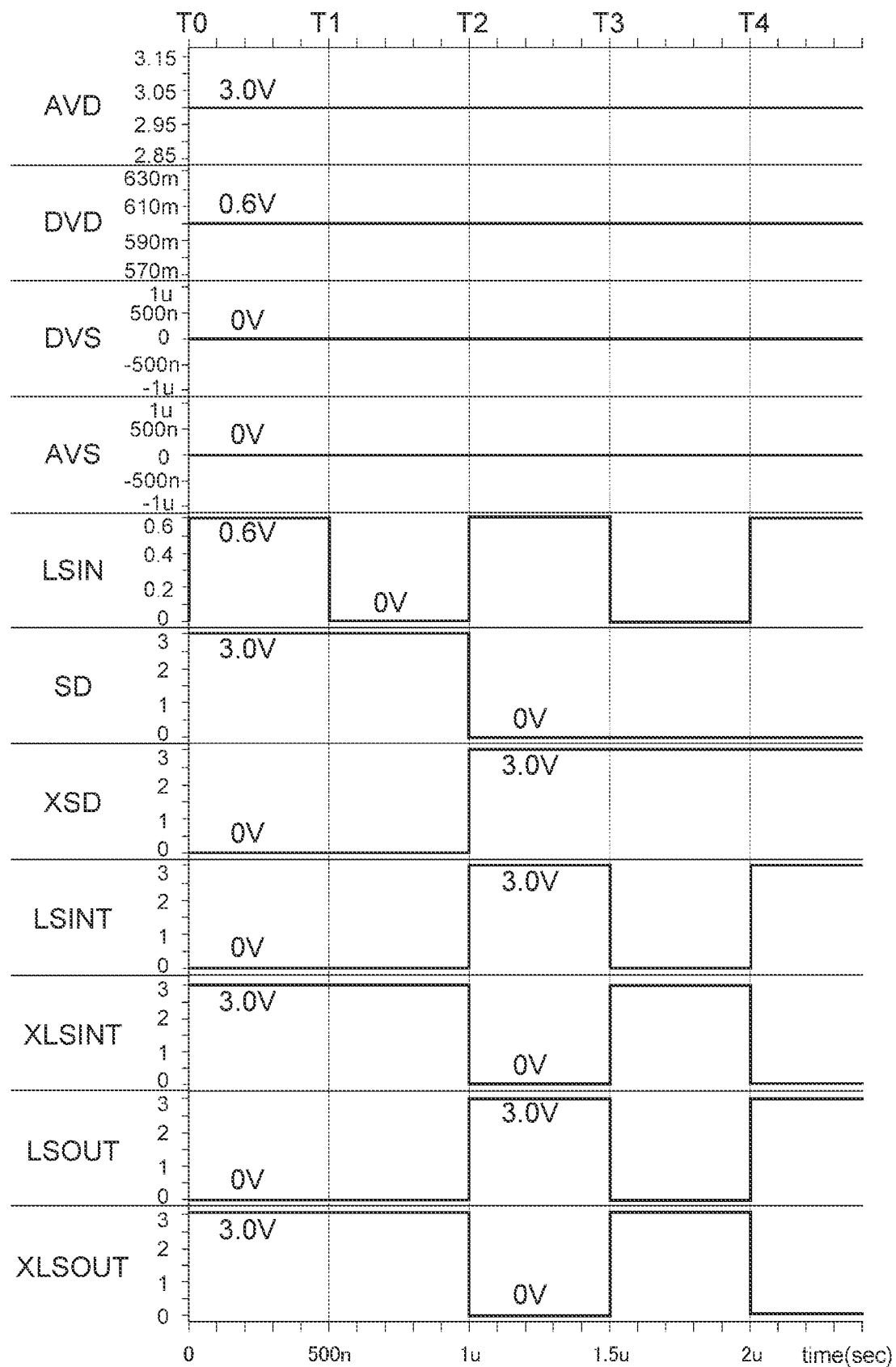
FIG. 6 is a time chart illustrating an example of a change in a voltage of each terminal included in the level shift circuit.

FIG. 5 is a truth table related to input and output of the level shift circuit 100. FIG. 6 is a time chart illustrating an example of a change in a voltage of each terminal included in the level shift circuit 100. The truth table of FIG. 5 and the time chart of FIG. 6 are a truth table and a time chart when the output initial value is (LSOUT=L, XLSOUT=H).

In FIG. 6, a temporal change in voltages of the AVD line 11a, the DVD line 10a, the DVS line 10b, the AVS line 11b, and respective terminals are given in order from top to bottom, the respective terminals being the LSIN terminal 12 (the input signal 1), the SD terminal 14a, the XSD terminal 14b, the LSINT terminal 15a (the in-phase node 5a), the XLSINT terminal 15b (the anti-phase node 5b), the LSOUT terminal 13a, and the XLSOUT terminal 13b.

In the example illustrated in FIG. 6, the AVD line 11a is set to 3.0 V, the DVD line 10a is set to 0.6 V, and the DVS line 10b and the AVS line 11b are both set to 0 V. Thus, an amplitude of a voltage of the LSIN terminal 12 (the input signal 1) that is provided in the DVD domain is 0.6 V. Further, amplitudes of voltages of the SD terminal 14a, the XSD terminal 14b, the LSINT terminal 15a, the XLSINT terminal 15b, the LSOUT terminal 13a, and the XLSOUT terminal 13b that are provided in the AVD domain are 3.0 V.

In FIG. 6, during a period of time from a time T0 to a time T2, the SD terminal 14a is set at a high level, and the XSD terminal is set at a low level. In other words, the level shift circuit 100 is in the standby state during the period of time up to the time T2. Note that, in the standby state, the first and second current-mirror circuits 26a and 26b are in an off state. Thus, there is no change in a level of an output terminal according to the input signal 1.

For example, in FIG. 6, there is a change in a voltage of the LSIN terminal 12 (the input signal 1) at the time T1 from a high level to a low level. In other words, there is a change in a logic level of the LSIN terminal 12 from 1 to 0. Even when there is a change in a logic level of the input signal 1, as described above, there is no change in output of the LSOUT terminal 13a and output of the XLSOUT terminal 13b in the standby state. Thus, as illustrated in FIG. 5, when the logic level of the XSD terminal 14b is 0 (the standby state), the logic level of the LSOUT terminal 13a continues to be 0, and the logic level of the XLSOUT terminal continues to be 1.

Further, when there is a change in a logic level of the XSD terminal 14b from 0 to 1, the state of the level shift circuit 100 is switched from the standby state to the active state.

Note that the output of the LSOUT terminal 13a and the output of the XLSOUT terminal 13b are not changed by only performing such switching. In FIG. 6, the SD terminal 14a is set at a low level and the XSD terminal 14b is set at a high level at the time T2. In other words, the level shift circuit 100 is in the active state during a period of time after the time T2.

In the active state (SD=L, XSD=H), the transmission gate 28a is turned on, and the pMOS transistor 64 is turned off. Consequently, the pMOS transistor 62 is diode-connected, and the gates of the PMOS transistors 62 and 63 are connected to the drain of the pMOS transistor 62. This results in the first current-mirror circuit 26a being in a state of being capable of supplying current.

Similarly, the transmission gate 28b is turned on, and the pMOS transistor 68 is turned off. Consequently, the pMOS transistor 66 is diode-connected, and the gates of the PMOS transistors 66 and 67 are connected to the drain of the pMOS transistor 66. This results in the second current-mirror circuit 26b being in a state of being capable of supplying current.

Further, in the active state, the pMOS transistor 74 and the nMOS transistor 54 are both turned off. Thus, a connection between the LSINT terminal 15a and the AVS line 11b is cut off, and a connection between the XLSINT terminal 15b and the AVD line 11a is cut off. This makes it possible to change potentials of the in-phase node 5a and the anti-phase node 5b.

For example, as illustrated in FIG. 5, when the logic level of the LSIN terminal is 1 (a high level), the logic level of the LSOUT terminal 13a (the in-phase node 5a) is 1 (a high level), and the logic level of the XLSOUT terminal 13b (the anti-phase node 5b) is 0 (a low level). Further, when the logic level of the LSIN terminal is 0, the logic level of the LSOUT terminal 13a (the in-phase node 5a) is 0, and the logic level of the XLSOUT terminal 13b (the anti-phase node 5b) is 1. A basic operation of the level shift circuit 100 in the active state is described below.

[Operation of Level Conversion]

An operation of a level conversion performed by the level shift circuit 100 with respect to the input signal 1 is described. An example in which the input signal 1 exhibiting a rising waveform and being changed from a low level to a high level is input to the level shift circuit 100 in the active state (for example, at the time T2 and at a time T4 in FIG. 6), is described below. Note that it is assumed that the in-phase node 5a is at a low level and the anti-phase node 5b is at a high level before the input signal 1 exhibiting a rising waveform is input.

The input signal 1 exhibiting a rising waveform is input to the LSIN terminal 12 that is an input terminal, and the LSIN terminal 12 is changed from a low level to a high level. In the first inverter circuit 24, the nMOS transistor 40 is turned on, the pMOS transistor 60 is turned off, and the intermediate node 4a goes to a low level (to have the same potential as the DVS line 10b). The voltage of the intermediate node 4a is output to the output side as the anti-phase signal 3 in anti-phase with respect to the input signal 1. The anti-phase signal 3 is a signal exhibiting a falling waveform and being changed from a high level to a low level.

When the intermediate node 4a goes to a low level, the nMOS transistor 41 is turned off and the pMOS transistor 60 is turned on in the second inverter circuit 24. Consequently, the intermediate node 4b goes to a high level (to have the same potential as the DVD line 10a). The voltage of the intermediate node 4b is output to the output side as the in-phase signal 2 in phase with the input signal 1. The in-phase signal 2 is a signal exhibiting a rising waveform and being changed from a low level to a high level. As described above, the in-phase signal 2 in phase with the input signal 1 and the anti-phase signal 3 in anti-phase with respect to the input signal 1 are generated by the input section 20.

The in-phase signal 2 is applied to the gate of the nMOS transistor 44 of the first current-mirror circuit 26a. Further, the anti-phase signal 3 is applied to the source of the nMOS transistor 44. In this case, the gate of the nMOS transistor 44 goes to a high level, and the source of the nMOS transistor 44 goes to a low level. This results in the nMOS transistor 44 being turned on. Note that the nMOS transistor 45 is in an on state since the gate of the nMOS transistor 45 has the same potential as the gate of the anti-phase node 5b (at a high level).

Thus, the first current path 29a that connects the AVD line 11a and the DVS line 10b via the pMOS transistor 62, and the nMOS transistors 45, 44, and 40, is brought into conduction by the nMOS transistor 44 being turned on. As described above, the nMOS transistor 44 brings the first current path 29a into conduction in response to the in-phase signal 2.

When the first current path 29a is brought into conduction, current similar to current flowing through the first current path 29a is replicated by the pMOS transistor 63 in the first current-mirror circuit 26a. In other words, current of which a current source is the AVD line 11a is generated between the source and the drain of the pMOS transistor 63.

The generated current is supplied to the in-phase node 5a connected to the drain of the pMOS transistor 63. This results in an increase in a potential of the in-phase node 5a at a low level such that the in-phase node 5a has the same potential as the AVD line 11a. In other words, the potential of the AVD line 11a is supplied to the in-phase node 5a.

As described above, the first current-mirror circuit 26a performs VI conversion to convert, into current, the in-phase signal 2 input as a voltage signal. Further, the first current-mirror circuit 26a performs IV conversion to supply current to the in-phase node 5a and increase a potential of the in-phase node 5a. Thus, the first current-mirror circuit 26a can be said to be a circuit that performs VI conversion on the input signal 1 (the in-phase signal 2), and further performs IV conversion to supply a potential to the in-phase node 5a.

In this case, the in-phase signal 2 serves as a signal that controls a switch used to operate the first current-mirror circuit 26a. Consequently, the operation of the first current-mirror circuit 26a becomes a simple switch operation, and this makes it possible to easily perform an on/off control of supply of the potential to the in-phase node 5a. In other words, the input section 20 can control supply of the potential to the in-phase node 5a without supplying, for example, power used to change a potential of the in-phase node 5a.

Further, the anti-phase signal 3 is applied to the gate of the nMOS transistor 47 of the second current-mirror circuit 26b. In this case, the gate of the nMOS transistor 47 goes to a low level, and the gate of the nMOS transistor 47 is turned off. Consequently, supply of current to the anti-phase node 5b that is performed by the second current-mirror circuit 26b is stopped. This will be described later.

Further, the anti-phase signal 3 is applied to the gate of the nMOS transistor 50 of the current regulator 22. In this case, the gate of the nMOS transistor 50 goes to a low level, and the nMOS transistor 50 is turned off. This results in interrupting a current path on the low-potential side that connects the in-phase node 5a and the AVS line 11b via the nMOS transistor 42 of the cross-coupled circuit 25.

In other words, when the input signal 1 goes to a high level, a current path on a low-potential side of the in-phase node 5a is interrupted. This results in cutting off current flowing through a current path on the low-potential side that is connected to the in-phase node 5a. As described above, in a state of being in phase with the input signal 1, the current regulator 22 regulates current flowing between the in-phase node 5a and the AVS line 11b.

This makes it possible to, for example, prevent the occurrence of, for example, current flowing into the AVS line 11b on the low-potential side from the in-phase node 5a. This results in preventing current of the p-channel (such as the pMOS transistor 63) on the high-potential side of the in-phase node 5a and current of the n-channel (such as the nMOS transistor 42) on the low-potential side of the in-phase node 5a from canceling each other out.

As described above, the current regulator 22 is connected to the AVS line 11b of a pair of power supply lines serving as the AVD power supply 11, and regulates current flowing between a node of the pair of nodes 5 and the AVS line 11b, the node of the pair of nodes 5 being supplied with a potential of the AVD line 11a. Since there is, for example, no current flow into the low-potential side, the potential of the in-phase node 5a is increased to the potential of the AVD line 11a on the high-potential side at a sufficiently high speed. This makes it possible to achieve a sufficient increase in speed with respect to, for example, a rising time necessary for an output signal to rise.

Note that the in-phase signal 2 is applied to the gate of the nMOS transistor 51 of the current regulator 22. In this case, the gate of the nMOS transistor 51 goes to a high level, and the nMOS transistor 51 is turned on. Further, the nMOS transistor 43 is turned on by the potential of the in-phase node 5a being increased. This results in the anti-phase node 5b being connected to the AVS line 11b through the nMOS transistors 43 and 51.

With the increase in the potential of the in-phase node 5a, the pMOS transistor 71 supplying the potential of the AVD line 11a to the anti-phase node 5b is turned off. This results in cutting off all of the supply of the high-potential-side potential (the AVD line 11a) to the anti-phase node 5b. Accordingly, the potential of the anti-phase node 5b is decreased to the potential of the AVS line 11b on the low-potential side at a sufficiently high speed.

As described above, when the potential of the in-phase node 5a is switched to a high level, the anti-phase node 5b is switched to a low level by the n-channel cross-coupled circuit 25. At this point, the operation of a level conversion (an operation of a level sift) to convert a high level in the DVD domain into a high level in the AVD domain is completed.

For example, as illustrated in FIG. 6, the voltage of the LSINT terminal 15a (the in-phase node 5a) is shifted from 0 V to 3.0 V at a timing at which the voltage of the LSIN terminal 12 (the input signal 1) rises from 0 V to 0.6 V (at the times T2 and T4). Further, the voltage of the XLSINT terminal 15b (the anti-phase node 5b) is shifted from 3.0 V to 0 V. Consequently, the voltage of the LSOUT terminal 13a goes to 3.0 V, and the voltage of the XLSOUT terminal 13b goes to 0 V.

Returning to FIG. 1, the potential of the anti-phase node 5b is applied to the gate of the nMOS transistor 45 of the first current-mirror circuit 26a when the operation of a level conversion is completed. In this case, the gate of the nMOS transistor 45 goes to a low level, and the nMOS transistor 45 is turned off. This results in interrupting the first current path 29a. In other words, the nMOS transistor 45 interrupts the first current path 29a in response to the potential of the anti-phase node 5b.

As described above, the feedback of a potential of the anti-phase node 5b (an output signal) results in interrupting an unnecessary flow-through current when the operation of a level conversion is completed. Here, the flow-through current is, for example, current flowing between the AVD line 11a and the DVS line 10b (the AVS line 11b). Thus, the first current-mirror circuit 26a can also be said to be a circuit that is driven at an early stage at which the potential of the in-phase node 5a is increased.

Note that, when the nMOS transistor 45 is turned off, the in-phase node 5a becomes a high-impedance Hi-Z node. This may result in being difficult to supply the potential from the AVD line 11a, and in being difficult to retain the in-phase node 5a at a high level.

In the present embodiment, the potential of the in-phase node 5a is retained at a high level by the potential retaining circuit 27. The potential retaining circuit 27 includes a function that retains the potential of the in-phase node 5a at a high level when the pMOS transistor 63 performing IV conversion is turned off due to an operation performed by the nMOS transistor 45. In other words, it can also be said that the potential retaining circuit 27 serves as a keeper of a high level.

As illustrated in FIG. 1, the potential of the anti-phase node 5b is applied to the gate of the pMOS transistor 70 of the potential retaining circuit 27. In this case, the gate of the pMOS transistor 70 goes to a low level, and the pMOS transistor 70 is turned on. Consequently, the in-phase node 5a is connected to the AVD line 11a through the pMOS transistor 70. This results in the potential of the in-phase node 5a being retained at a high level.

Further, as described above, the potential of the in-phase node 5a is applied to the gate of the pMOS transistor 71 of the potential retaining circuit 27, and the pMOS transistor 71 is turned off due to an increase in the potential of the in-phase node 5a. Thus, the potential of the anti-phase node 5b is retained at a low level when the potential of the in-phase node 5a is at a high level.

As described above, the potential retaining circuit 27 retains the potential of the in-phase node 5a on the basis of the potential of the anti-phase node 5b, and retains the potential of the anti-phase node 5b on the basis of the potential of the in-phase node 5a. In other words, the potential retaining circuit 27 can also be said to be a latch circuit that prevents high level floating in which the potential of the in-phase node 5a (or the anti-phase node 5b) floats due to an anti-phase potential (an anti-phase clock) being applied. This makes it possible to make output of the level shift circuit 100 stable, and thus to properly perform an operation of a level conversion.

[Measures Against Leakage Current]

The occurrence of a leakage current when the in-phase node 5a is changed to a high level (LSINT=H) is sufficiently suppressed by the nMOS transistors 50 and 45 being turned off. In other words, on the side of the in-phase node 5a, an unnecessary flow-through current (a leakage current) flowing from the AVD line 11a to the AVS line 11b is not generated by the current path on the low-potential side of the in-phase node 5a and the first current path 29a being interrupted.

On the other hand, on the side of the anti-phase node 5b, a signal or the like used to close a gate is not applied to the pMOS transistor 67 connected to the anti-phase node 5b. In other words, the gate of the pMOS transistor 67 is closed due to a self-biasing force. In this case, the pMOS transistor 67 increases the gate potential such that, for example, the occurrence of current between the source and the drain is suppressed.

For example, when the level of a self-bias (Vgs) is (AVD−Vthp), the pMOS transistor 67 operates in a subthreshold region. Here, AVD is a potential of the AVD line 11a, and Vthp is a threshold voltage of the pMOS transistor 67.

In the subthreshold region, the pMOS transistor 67 is caused to operate more slowly. Thus, there is a possibility that the pMOS transistor 67 will not be completely turned off in a realistic temporal range (for example, in a clock cycle of the input signal 1). In this case, it is conceivable that, in a current path on the low-potential side of the anti-phase node 5b, a leakage current is generated through, for example, the nMOS transistor 51 that is a MOS transistor of LVT.

In the present embodiment, the in-phase signal 2 is applied to the source of the nMOS transistor 47 arranged in the second current path 29b, in order to avoid the state described above. Note that, as described above, the anti-phase signal 3 is applied to the gate of the nMOS transistor 47. In this case, the gate of the nMOS transistor 47 goes to a low level, and the source of the nMOS transistor 47 goes to a high level.

Thus, a negative gate voltage Vgs (gate potential-source potential) is applied to the nMOS transistor 47. In other words, the nMOS transistor 47 is in an off state in a region of a sufficiently low gate voltage. Consequently, the gate voltage of the nMOS transistor 47 becomes a voltage lower than a voltage of a normal off-level (for example, Vgs=0 V), and the nMOS transistor 47 is completely turned off.

For example, there is a possibility that, a gate of a MOS transistor of LVT will not be completely closed even when the gate voltage is 0 V and thus an off-state current will be generated. Thus, for example, the configuration in which the source of the nMOS transistor 47 is connected to, for example, the AVS line 11b may result in an off-state current being generated, and in the off-state current being replicated by the second current-mirror circuit 26b.

On the other hand, the present embodiment adopts a configuration in which a signal of a reverse bias with respect to a potential of the anti-phase node 5b, is applied to the source of the input nMOS transistor 47 of the second current-mirror circuit 26b, and this results in interrupting a leakage current. This makes it possible to interrupt an off-state current flowing through the pMOS transistor 67, that is, a leakage current flowing through the anti-phase node 5b.

Further, an off-state current is also sufficiently prevented in the nMOS transistor 47 when, for example, the threshold voltage is changed with temperature, since a sufficiently low gate voltage is applied to the nMOS transistor 47. According to such a configuration, the leakage characteristics almost independent of temperature are obtained in the AVD domain.

[Speed of Operation]

The level-shifting circuit 100 has a configuration in which the DVD domain and the AVD domain are connected to each other through the sources of the respective nMOS transistors 44 and 47. For example, when the input signal 1 exhibiting a rising waveform is input, the speed of an operation of a level conversion depends on the speed of a pull-down operation to decrease the potential on an input side of the first current-mirror circuit 26a (the source of the nMOS transistor 44).

In this case, the source of the nMOS transistor 44 is connected to the DVS line 10*b* through the nMOS transistor 40. The nMOS transistor 40 is a MOS transistor of the second type, and is a thick film Tr that has a withstand voltage (3.3 V) for the AVD power supply 11 and has a low threshold voltage (LVT). For example, the thick film Tr of LVT exhibits a high performance in causing current to flow between the source and the drain and has a low threshold voltage, and this results in performing an operation at a high speed. In other words, when the nMOS transistor 40 is a thick film Tr of LVT, this makes it possible to perform the pull-down operation with respect to the nMOS transistor 44 at a higher speed.

Further, when the input signal 1 exhibiting a rising waveform is input, the nMOS transistor 47 is turned off with a low gate voltage, due to a pull-up operation being performed to increase the potential on an input side of the second current-mirror circuit 26*b* (the source of the nMOS transistor 47). The pull-up operation is an operation for which speed is not necessary, as compared with, for example, the pull-down operation described above.

In this case, the source of the nMOS transistor 44 is connected to the DVD line 10*a* through the pMOS transistor 61. The pMOS transistor 61 is a MOS transistor of the third type, and is a thick film Tr that has a withstand voltage (1.8 V) for the DVD power supply 10 and has a standard threshold voltage (SVT). The thick film Tr of 1.8 V is an element that is capable of properly controlling a gate at a voltage level of the DVD power supply 10, and of, for example, sufficiently suppressing the occurrence of an off-state current, as compared with, for example, a thick film Tr of LVT.

For example, the gate of the thick film Tr of 1.8 V has an elongated L length, and this may result in generating some leakage current. However, the degree of the generation is sufficiently small, compared to the case of a logical standby current in the DVD domain. Thus, when the pMOS transistor 61 for which speed is not necessary is a thick film Tr of 1.8 V, this makes it possible to suppress the occurrence of a leakage current in the DVD-domain as much as possible.

As described above, a thick film Tr (the nMOS transistors 40 and 41) of LVT is used on the low-potential side of the input section 20 (the DVD-domain) of the level shift circuit 100. Consequently, an operation is performed at a higher speed on the n-channel side on which a speed of an operation of a level conversion is determined. This makes it possible to improve a speed of an operation of the level shift circuit 100.

Further, a thick film Tr (the pMOS transistors 60 and 61) of 1.8 V is used on the high-potential side of the input section 20. Consequently, the occurrence of an off-state current is suppressed that is generated on the p-channel side on which a reverse bias is applied to an input of the current-mirror circuit. This makes it possible to achieve both a leakage suppression and a low-voltage operation in the DVD domain, and thus to properly convert the level of a signal with a low voltage while reducing power consumption.

The case in which the input signal 1 exhibiting a rising waveform is input has been described above. On the other hand, when the input signal 1 exhibiting a falling waveform and being changed from a high level to a low level is input (for example, at a time T3 in FIG. 6), the level of each of the components included in the level shift circuit 100 is changed in a manner opposite to when the input signal 1 exhibiting a rising waveform is input.

For example, when the input signal 1 exhibiting a falling waveform is input, the anti-phase signal 3 goes to a high level, and the in-phase signal 2 goes to a low level. In the second current-mirror circuit 26*b*, the nMOS transistor 47 brings the second current path 29*b* into conduction in response to the anti-phase signal 3. This results in the anti-phase node 5*b* being supplied with current.

Further, the in-phase signal 2 at a low level is applied to the gate of the nMOS transistor 51 of the current regulator 22, and the nMOS transistor 51 is turned off. In other words, when the input signal 1 is at a low level, the current path on the low-potential side of the anti-phase node 5*b* is interrupted. As described above, in a state of being in anti-phase with respect to the input signal 1, the current regulator 22 regulates current flowing between the anti-phase node 5*b* and the AVS line 11*b*.

Consequently, the potential of the anti-phase node 5*b* is rapidly increased to a high level. Further, the potential of the in-phase node 5*a* goes to a low level through the cross-coupled circuit. Accordingly, the operation of a level conversion performed when the input signal 1 exhibiting a falling waveform is input is completed.

The potential of the in-phase node 5*a* at a low level is applied to the gate of the nMOS transistor 48, and the nMOS transistor 48 is turned off. In other words, the nMOS transistor 48 interrupts the second current path 29*b* in response to the potential of the in-phase node 5*a*. This results in interrupting an unnecessary flow-through current flowing through the second current path 29*b*. Further, supply of current to the anti-phase node 5*b* that is performed by the second current-mirror circuit 26*b* is stopped.

Further, the potential of the in-phase node 5*a* is applied to the gate of the pMOS transistor 71 of the potential retaining circuit 27, and the pMOS transistor 71 is turned on. Consequently, the anti-phase node 5*b* is connected to the AVD line 11*a* through the pMOS transistor 71. This results in the potential of the anti-phase node 5*b* being retained at a high level. As described above, the potential retaining circuit 27 retains the potential of the anti-phase node 5*b* on the basis of the potential of the in-phase node 5*a*.

As described above, in the level shift circuit 100 according to the present embodiment, the input signal 1 of the DVD power supply 10 is input. According to the input signal 1, one of the pair of nodes 5 is supplied with the potential of the AVD line 11*a* of a pair of power supply lines forming the AVD power supply 11 of which a voltage level is higher than a voltage level of the DVD power supply 10. Further, current flowing between the node supplied with the potential of the AVD line 11*a*, and the AVS line 11*b* is regulated. This makes it possible to easily supply the potential of the AVD line 11*a* included in the AVD power supply 11 even when, for example, the voltage level of the DVD power supply 10 is low, and thus to convert the level of a signal with a low voltage while reducing power consumption.

Figure 7:
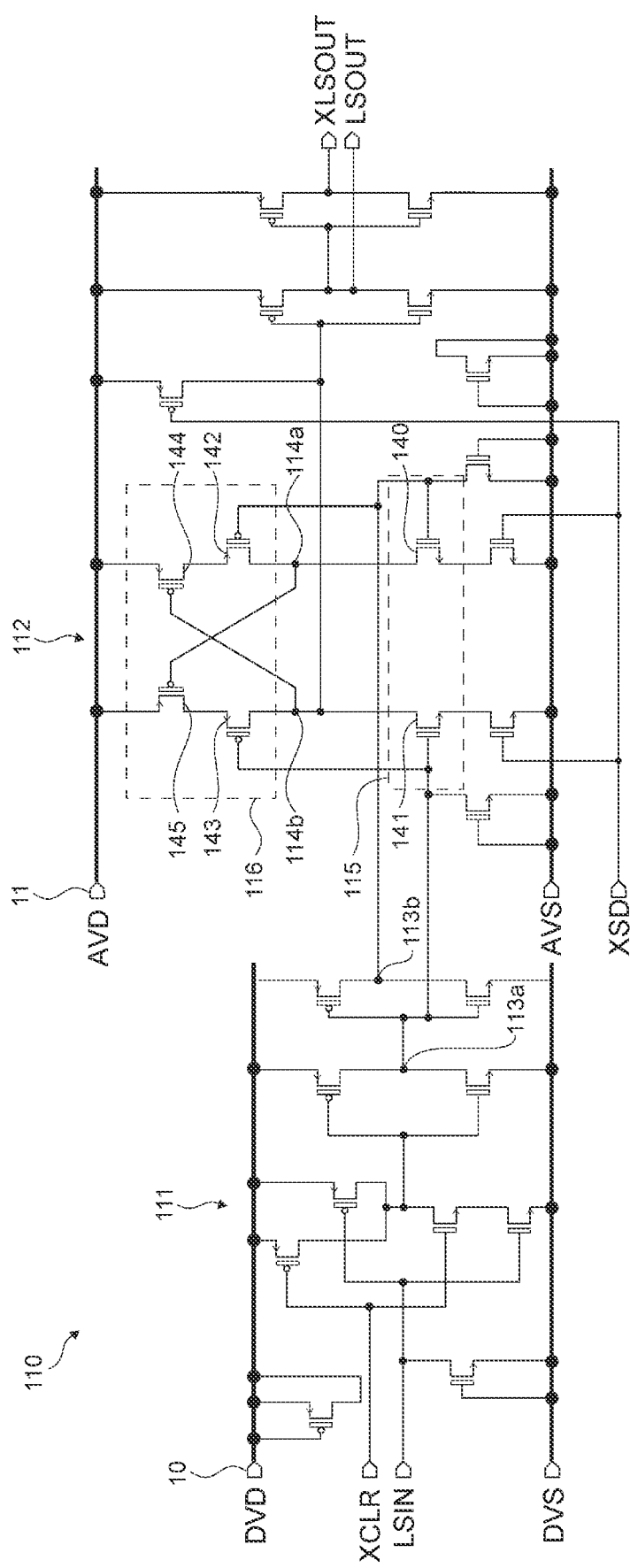
FIG. 7 is a circuit diagram of a level shift circuit of a comparative example.

FIGS. 7 and 8 are circuit diagrams of level shift circuits of comparative examples. Level shifting circuits 110 and 120 that are respectively illustrated in FIGS. 7 and 8 are circuits that each convert the level of the input signal 1 input from an LSIN terminal into the voltage level of the AVD power supply 11 from the voltage level of the DVD power supply 10, and each output a signal obtained by the conversion from an LSOUT terminal and an XLSOUT terminal.

As illustrated in FIG. 7, the level shift circuit 110 includes an input section 111 that is connected to the DVD power supply 10 (the DVD line and the DVS line), and a level converter 112 that is connected to the AVD power supply 11 (the AVD line and the AVS line). The input section 111 outputs, via intermediate nodes 113a and 113b, the in-phase signal 2 in phase with the input signal 1, and the anti-phase signal 3 in anti-phase with respect to the input signal 1, the input signal 1 being input to the LSIN terminal. The level converter 112 is a typical cross-coupled circuit, and includes an in-phase node 114a, an anti-phase node 114b, an n-channel section 115, and a p-channel section 116. Note that all of the MOS transistors included in the level shift circuit 110 are thick film Tr's.

The n-channel section 115 includes an nMOS transistor 140 that is connected on a low-potential side of the in-phase node 114a, and an nMOS transistor 141 that is connected on a low-potential side of the anti-phase node 114b. The nMOS transistors 140 and 141 are connected to the AVS line through respective nMOS transistors that are in an on state during an operation of a level conversion. Gates of the nMOS transistors 140 and 141 are respectively connected to the intermediate nodes 113b and 113a.

The p-channel section 116 includes pMOS transistors 142 to 145, the pMOS transistor 142 being connected on a high-potential side of the in-phase node 114a, the pMOS transistor 143 being connected on a high-potential side of the anti-phase node 114b, the pMOS transistor 144 being connected between the pMOS transistor 142 and the AVD line, the pMOS transistor 145 being connected between the pMOS transistor 143 and the AVD line. Gates of the pMOS transistors 142 and 143 are respectively connected to the intermediate nodes 113b and 113a. Gates of the pMOS transistors 144 and 145 are respectively connected to the anti-phase node 114b and the in-phase node 114a to form a cross-coupled circuit.

For example, it is assumed that the input signal 1 exhibiting a rising waveform and being changed from a low level to a high level is input. In this case, the in-phase node 114a is at a low level and the anti-phase node 114b is at a high level in an initial state before an operation of a level conversion is performed.

For example, the nMOS transistor 141 in a state in which the in-phase signal 3 (at a high level) is applied to the gate of the nMOS transistor 141, is turned on, and this results in causing current to flow out of the anti-phase node 114b at a high level. On the other hand, current is supplied to the anti-phase node 114b at a high level from the p-channel section 116 (the pMOS transistors 143 and 145). Thus, in order to change the level of the anti-phase node 114b to a low level, the nMOS transistor 141 has to cause a sufficient amount of current to flow.

As described above, the level shift circuit 110 can be said to be a circuit that generates an action that causes current of the n-channel section 115 and current of the p-channel section 116 to be opposite to each other, so that the p-channel current and the n-channel current cancel each other out. Thus, it is necessary for the n-channel section 115 to exhibit a performance sufficient to be superior to the p-channel section 116. In this case, for example, there is a need to make the nMOS transistor 141 relatively larger in size than, for example, the pMOS transistor 143 in order to improve a performance in causing current to flow.

When the configuration of the level shift circuit 110 is applied in, for example, state-of-the-art processes in which the gate width is less than 22 nm, the voltage of the DVD power supply 10 is decreased to 0.63 V from a previous voltage of 0.94 V. Thus, the nMOS transistors 140 and 141 may be made considerably larger in size.

The level shift circuit 120 illustrated in FIG. 8 is a circuit in which all of the nMOS transistors are thin film Tr's, and this results in improving an n-channel performance. In the level shift circuit 120, nMOS transistors 146 and 147 that are included in an n-channel section 125 are thin film Tr's of which a gate insulation film is sufficiently thin. For example, a 0.7-V Tr of which a withstand voltage is 0.7 V is used as a thin film Tr. This results in improving a performance of the n-channel section 125. On the other hand, there is a need to take sufficient withstand-voltage measures since the thin film Tr is provided in the AVD domain.

For example, in the level shift circuit 120, an nMOS transistor 148 of LVT that is used for withstand-voltage protection is provided on a high-potential side (in a higher layer) of the nMOS transistor 146, and an nMOS transistor 149 of LVT that is used for withstand-voltage protection is provided on a high-potential side (in a higher layer) of the nMOS transistor 147, in order to perform withstand-voltage protection. As described above, an off-state current may flow through a thin film Tr or an LVT device, and there may be an increase in leakage current. Further, there may be a need for a large number of crossed diodes between DVD and AVS in order to take electrostatic-discharge (ESD) measures.

In the present embodiment, the nMOS transistors 50 and 51 included in the current regulator 22 are turned off when the potentials of the in-phase node 5a and the anti-phase node 5b are increased. Accordingly, the current path between the in-phase node 5a and the AVS line 11b, and the current path between the anti-phase node 5b and the AVS line 11b are interrupted when the in-phase node 5a and the anti-phase node 5b are supplied with current from the AVD line 11a.

This results in preventing current of the p-channel (such as the pMOS transistors 63, 67, 71, and 70) on the high-potential side, and current of the n-channel (such as the nMOS transistors 42, 43, 50, and 51) on the low-potential side from canceling each other out. From another point of view, it can also be said that the level shift circuit 100 does not include a current path in which a p-channel current and an n-channel current cancel each other out.

This makes it possible to properly perform an operation of a level conversion regardless of the ratio between a p-channel and an n-channel in a performance in causing current to flow (a P/N current performance ratio). This makes it possible to, for example, combine an n-channel that operates in a power supply domain of a lower voltage with a p-channel having a normal output level. This makes it possible to convert the level of a signal at a lower voltage level.

In, for example, the level shift circuit 110 of the comparative example (refer to FIG. 7), the performance of the n-channel section is reduced as the voltage level of the DVD power supply 10 is decreased, as compared with the p-channel section. Consequently, when the voltage level of the DVD power supply 10 reaches a certain value (for example, about 0.8 V), the operation of a level conversion is not successfully performed regardless of, for example, the frequency of the input signal 1, and this results in rapidly increasing, for example, a rising delay time necessary to rise the potential of a node.

On the other hand, the present embodiment makes it possible to perform an operation of a level conversion regardless of the P/N current performance ratio. Thus, it is possible to perform the operation at for example, a voltage level of the DVD power supply 10 that is sufficiently lower than the voltage level of the DVD power supply 10 of the level shift circuit 110 (for example, 0.6 V or less). As described above, the level shift circuit 100 makes it possible to relieve a bottleneck related to a voltage level of the DVD power supply 10 by preventing a path from being in a state in which currents cancel each other out. Further, an operation of a level conversion does not suddenly fail even when there is a decrease in voltage, since currents do not cancel each other out. This makes it possible to improve the quality of an apparatus.

Further, a circuit configuration independent of the P/N current performance ratio makes it possible to easily perform, for example, a constant design for each MOS transistor. For example, the adoption of the design illustrated in FIG. 1 in which a MOS transistor of the second type (a thick film Tr of LVT) operates properly makes it possible to set respective design parameters (such as a threshold voltage) of a MOS transistor on the side of the AVD domain, regardless of the side of the DVD domain. This makes it possible to improve the efficiency in design.

Further, the level shift circuit 100 is designed such that all of the MOS transistors included in the level shift circuit 100 are thick film Tr's and a thin film Tr is not used. In other words, the level shift circuit 100 is applicable in, for example, state-of-the-art processes, but the level shift circuit 100 is independent of the P/N current capacity ratio and has a configuration in which a thin film Tr is not used.

This makes it possible to, for example, reduce the number of ESD elements (such as crossed diodes) necessary to take ESD measures. This results in being able to reduce a chip area, and thus to form a small circuit. This makes it possible to make an apparatus smaller and to reduce costs for the apparatus.

In the present embodiment, for example, MOS transistors of the first to third types in which withstand voltages and threshold voltages of respective thick film Tr's are set, are used such that the occurrence of a leakage current in the entirety of a circuit is suppressed. As described above, it is possible to perform an operation with a low voltage without using a thin film Tr, by making good use of the characteristics of the types of thick film Tr's in a topology independent of the P/N current performance ratio. This results in being able to provide a high-speed level shift circuit 100 for which the area is small and of which an amount of leakage current is small.

Second Embodiment

A level shift circuit according to a second embodiment of the present technology is described. In the following description, descriptions of a configuration and an operation similar to those of the level shift circuit 200 described in the embodiment above are omitted or simplified.

Figure 9:
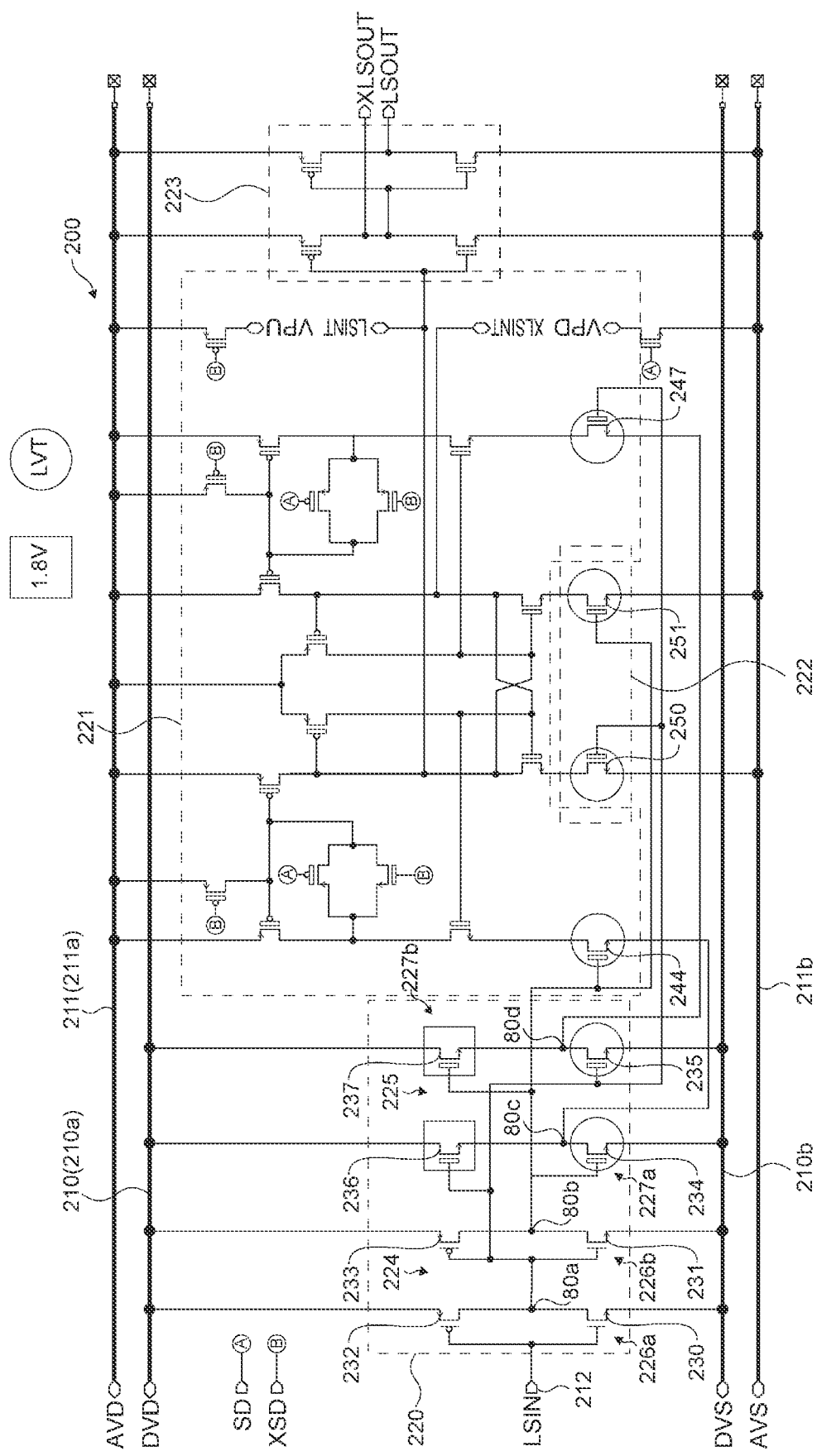
FIG. 9 is a circuit diagram illustrating an example of a configuration of a level shift circuit according to a second embodiment.
Figure 10:
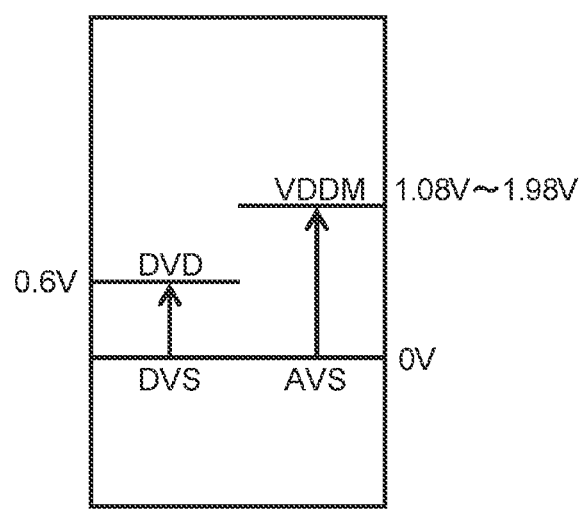
FIG. 10 schematically illustrates examples of power supply voltages of a DVD power supply and an AVD power supply that are illustrated in FIG. 9.

FIG. 9 is a circuit diagram illustrating an example of a configuration of the level shift circuit according to the second embodiment. FIG. 10 schematically illustrates examples of power supply voltages of a DVD power supply 220 and an AVD power supply 211 that are illustrated in FIG. 9. As illustrated in FIG. 9, a level shift circuit 200 includes an input section 220, a potential supply section 221, a current regulator 222, and an output section 223. The level shift circuit 200 is primarily different from the level shift circuit 100 described in the first embodiment in that the input section 220 has a different configuration.

In the present embodiment, low-potential-side power supply lines (a DVS line 210b and an AVS line 211b) of the DVD power supply 210 and the AVD power supply 211 are set to 0 V, as illustrated in FIG. 10. Further, an AVD line 211a on a high-potential side of the AVD power supply 211 is set to, for example, from 1.08 V to 1.98 V. In this voltage range, it is possible to form an AVD-domain circuit using a Tr of which a withstand voltage is 1.8 V, which will be described later. Moreover, the voltage range of the AVD line 211a is not limited, and may be set as appropriate according to, for example, the use of the level shift circuit 200. A DVD line 210a on a high-potential side of the DVD power supply 210 is set to a voltage (for example, 0.6 V) lower than the voltage of the AVD line 211a. The voltage range of the DVD line 210a is not limited.

For example, the potential supply section 221, the current regulator 222, and output section 223 illustrated in FIG. 9 are obtained by changing the MOS transistors of the potential supply section 21, the current regulator 22, and the output section 23 described with reference to FIG. 1 from a thick film Tr of a withstand voltage of 3.3 V to a thick film Tr of a withstand voltage of 1.8 V. In other words, for example, a MOS transistor of a first type in the level shift circuit 200 is a MOS transistor (1.8V-SVT-Tr) that has a withstand voltage of 1.8 V and of which a threshold voltage is SVT. Further, for example, a MOS transistor of a second type (a circled MOS transistor) is a MOS transistor (1.8V-LVT-Tr) that has a withstand voltage of 1.8 V and of which a threshold voltage is LVT.

The input section 220 includes a first signal-generation circuit 224 and a second signal-generation circuit 225. The first signal-generation circuit 224 includes a first inverter circuit 226a and a second inverter circuit 226b. The first and second inverter circuits 226a and 226b generate an anti-phase signal in anti-phase with respect to an input signal, and an in-phase signal in phase with the input signal.

The first inverter circuit 226a includes an nMOS transistor 230 and a pMOS transistor 232 that are connected to each other through an intermediate node 80a. A gate of the nMOS transistor 230 is connected to an LSIN terminal 212, a source of the nMOS transistor 230 is connected to the DVS line 210b, and a drain of the nMOS transistor 230 is connected to an intermediate node 80a. A gate of the pMOS transistor 232 is connected to the LSIN terminal 212, a source of the pMOS transistor 232 is connected to the DVD line 210a, and a drain of the pMOS transistor 232 is connected to the intermediate node 80a.

The second inverter circuit 226b includes an nMOS transistor 231 and a pMOS transistor 233 that are connected to each other through an intermediate node 80b. A gate of the nMOS transistor 231 is connected to the intermediate node 80a, a source of the nMOS transistor 231 is connected to the DVS line 210b, and a drain of the nMOS transistor 231 is connected to the intermediate node 80b. A gate of the pMOS transistor 232 is connected to the intermediate node 80a, a source of the pMOS transistor 232 is connected to the DVD line 210a, and a drain of the pMOS transistor 232 is connected to the intermediate node 80b.

In the present embodiment, the first signal-generation circuit 224 is formed using a thin film Tr. In other words, the nMOS transistors 230 and 231 and the pMOS transistors 232 and 233 are thin film Tr's. This makes it possible to generate an anti-phase signal and an in-phase signal that have amplitude ranges identical to the voltage level of the DVD power supply 210.

The second signal-generation circuit 225 is a circuit that generates a signal input to sources of nMOS transistors 244 and 247 of the potential supply section 221. The second signal-generation circuit 225 includes a first drive circuit 227a and a second drive circuit 227b.

The first drive circuit 227a includes an nMOS transistor 234 and an nMOS transistor 236 that are connected to each other through an intermediate node 80c. A gate of the nMOS transistor 234 is connected to the intermediate node 80b, a source of the nMOS transistor 234 is connected to the DVS line 210b, and a drain of the nMOS transistor 234 is connected to the intermediate node 80c. A gage of the nMOS transistor 236 is connected to the intermediate node 80a, a source of the nMOS transistor 236 is connected to the DVD line 210a, and a drain of the nMOS transistor 236 is connected to the intermediate node 80c. Further, the intermediate node 80c is connected to the source of the nMOS transistor 244 of the potential supply section 221.

The second drive circuit 227b includes an nMOS transistor 235 and an nMOS transistor 237 that are connected to each other through an intermediate node 80d. A gate of the nMOS transistor 235 is connected to the intermediate node 80a, a source of the nMOS transistor 235 is connected to the DVS line 210b, and a drain of the nMOS transistor 235 is connected to the intermediate node 80d. A gate of the nMOS transistor 236 is connected to the intermediate node 80b, a source of the nMOS transistor 236 is connected to the DVD line 210a, and a drain of the nMOS transistor 236 is connected to the intermediate node 80d. Further, the intermediate node 80d is connected to the source of the nMOS transistor 247 of the potential supply section 221.

As described above, the first and second drive circuits 227a and 227b are NN-type signal generating circuits (NN drivers) each formed of a pair of nMOS transistors that are respectively situated on the low-potential side and the high-potential side and are connected to each other through an intermediate node. Such a configuration results in an anti-phase signal in anti-phase with respect to an input signal, and an in-phase signal in phase with the input signal being generated by the first and second drive circuits 227a and 227b on the basis of output of the first signal-generation circuit 224.

In the present embodiment, the nMOS transistors 234 and 235 are MOS transistors of the second type that each have a withstand voltage for AVD power supply and of which a threshold voltage is LVT. Further, the nMOS transistors 236 and 237 are MOS transistors of a third type that has a withstand voltage for DVD power supply and of which a threshold voltage is SVT. Note that, in the present embodiment, the withstand voltage for AVD power supply and the withstand voltage for DVD power supply are each set to 1.8 V. As described above, the second signal-generation circuit 225 includes an nMOS transistor of the second type that is connected on the low-potential side of the DVD power supply 210, and an nMOS transistor of the third type that is connected on the high-potential side of the DVD power supply 210.

As illustrated in FIG. 9, the intermediate node 80a of the first inverter circuit 226a is connected to a gate of the nMOS transistor 247 of the potential supplying circuit 221 and to a gate of an nMOS transistor 250 of the current regulator 222. The intermediate node 80b of the second inverter circuit 226b is connected to a gate of the nMOS transistor 244 of the potential supply section 221 and to a gate of an nMOS transistor 251 of the current regulator 222. Thus, the anti-phase signal and the in-phase signal that are generated by the first signal-generation circuit 224 are signals used to control gates of respective nMOS transistors in the AVD-domain.

It is favorable that a gate input signal with respect to each MOS transistor of which a gate is connected to the input section 220 be changed with a highest amplitude of the DVD power supply 210 in terms of a performance in controlling a gate. In the present embodiment, the first signal-generation circuit 224 is formed using a thin film Tr, as described above. In other words, each gate input signal (an in-phase signal and an anti-phase signal) is a signal buffered by a thin film Tr. This makes it possible to accurately control each MOS transistor. Note that the thin film Tr is not directly connected to the AVD line 211a. In other words, a thin film Tr does not exist in the AVD power supply 211, which is a different power supply. Thus, there is no problem in terms of ESD.

As illustrated in FIG. 9, a current path from the AVD line 211a to the source of the nMOS transistor 244 and a current path from the AVD line 211a to the source of the nMOS transistor 247 are formed in the potential supply section 221. In other words, it can also be said that the potential supply section 221 includes a pair of current paths each connected to the input section 220 and the AVD line 211a.

On the basis of output of the first signal-generation circuit 224, the second signal-generation circuit 225 generates an anti-phase signal in anti-phase with respect to an input signal, and an in-phase signal in phase with the input signal, the anti-phase signal and the in-phase signal being input to a pair of current paths. For example, the anti-phase signal generated by the first drive circuit 227a is applied to the source of the nMOS transistors 244. Further, the in-phase signal generated by the second drive circuit 227b is applied to the source of the nMOS transistor 247. Accordingly, the respective nMOS transistors 244 and 247 are reverse-biased, and this makes it possible to suppress the occurrence of a leakage current.

In, for example, the input section 20 illustrated in FIG. 1, the speed of a low-voltage operation performed when the DVD power supply 210 is at a lower voltage may be restricted due to Vthp of the pMOS transistors 60 and 61, which are thin film Tr's.

In the present embodiment, the thick-film nMOS transistors 236 and 237 having a withstand voltage of 1.8 V are used as elements connected on the high-potential side, and this results in performing a low-voltage operation at a higher speed. As described above, a circuit connected to an input terminal of the potential supply section 221 is changed from a PN-type signal generating circuit (a PN driver) to an NN driver, and this makes it possible to perform an operation of a level conversion with a low voltage at a higher speed.

Note that the potential used to reverse-bias an input terminal of the potential supply section 221 exhibits a value (DVD−Vthn) that is smaller than a voltage level of the DVD power supply by a threshold voltage of each of the nMOS transistors 236 and 247. Thus, an effect of suppressing the occurrence of a leakage current may be somewhat smaller. Thus, the configuration illustrated in FIG. 9 can also be said to be a configuration balanced in order to achieve both suppression of the occurrence of a leakage current and speeding up.

Third Embodiment

Figure 11:
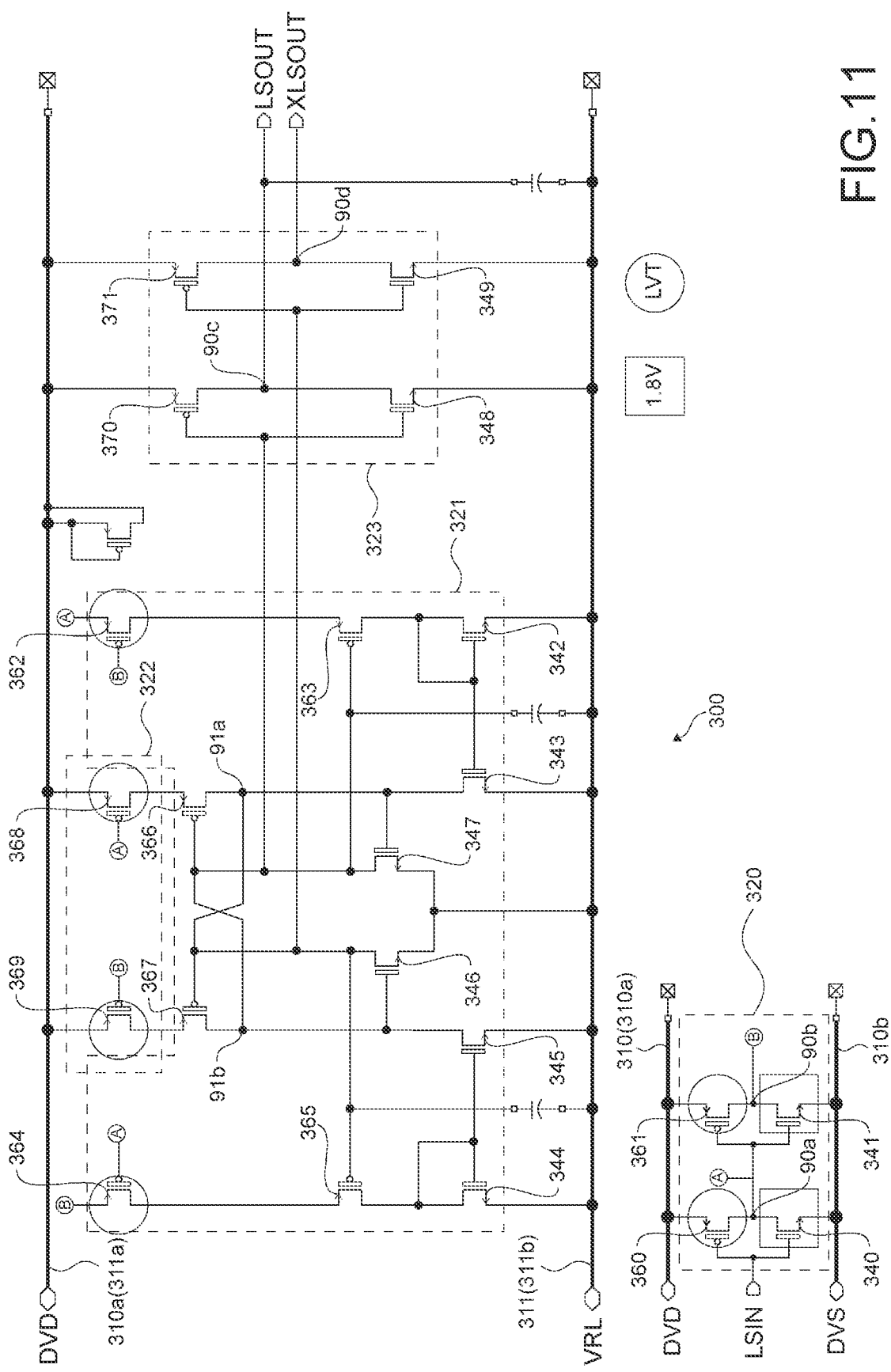
FIG. 11 is a circuit diagram illustrating an example of a configuration of a level shift circuit according to a third embodiment.
Figure 12:
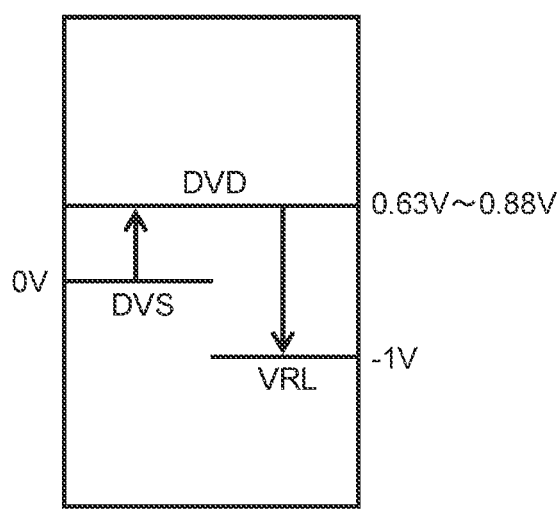
FIG. 12 schematically illustrates examples of power supply voltages of a DVD power supply and a VRL power supply that are illustrated in FIG. 11.

FIG. 11 is a circuit diagram illustrating an example of a configuration of a level shift circuit according to a third embodiment. FIG. 12 schematically illustrates examples of power supply voltages of a DVD power supply 310 and a VRL power supply 311 that are illustrated in FIG. 11. In the present embodiment, a level shift circuit 300 serves as a negative level shifter. The negative level shifter is, for example, a circuit that shifts an input signal to a signal having a negative voltage level.

As illustrated in FIG. 12, the VRL power supply 311 is a power supply of which a voltage level is higher than a voltage level of the DVD power supply 310. In the present embodiment, the DVD power supply 310 corresponds to a first power supply system, and the VRL power supply 311 corresponds to a second power supply system. A power supply line (a DVD line 310a, 311a) is shared on a high-potential side of the DVD power supply 310 and on a high-potential side of the VRL power supply 311, and is set to, for example, from 0.63 V to 0.88 V. A VRL line 311*b* on a low-potential side of the VRL power supply 311 is set to a negative potential (for example, −1 V). A DVS line 310*b* on a low-potential side of the DVD power supply 310 is set to a voltage higher than a voltage of the VRL line 311*b* (for example, 0 V).

The level shift circuit 300 includes an input section 320, a potential supply section 321, a current regulator 322, and an output section 323. As illustrated in FIG. 11, basic configurations of the potential supply section 321, the current regulator 322, and the output section 323 are obtained by, for example, swapping an nMOS transistor and a pMOS transistor in the level shift circuit 100 described with reference to FIG. 1.

The input section 320 is connected to the DVD power supply 310. The input section 320 includes an nMOS transistor 340 and a pMOS transistor 360 that are connected to each other through an intermediate node 90*a*, and an nMOS transistor 341 and a pMOS transistor 361 that are connected to each other through an intermediate node 90*b*.

Gates of the nMOS transistor 340 and the pMOS transistor 360 are each connected to an LSIN terminal. Gates of the nMOS transistor 341 and the pMOS transistor 361 are each connected to the intermediate node 90*a*. Note that wiring that connects the intermediate nodes 90*a* and 90*b*, and a circuit on the output side is omitted in FIG. 11.

The potential supply section 321 includes an in-phase node 91*a*, an anti-phase node 91*b*, pMOS transistors 362 to 367, and nMOS transistors 342 to 347. As illustrated in FIG. 11, the potential supply section 321 is connected to a power supply line (the VRL line 311*b*) on the low-potential side of the VRL power supply 311. In the present embodiment, the VRL line 311*b* corresponds to one of a pair of power supply lines.

A gate of the pMOS transistor 362 is connected to the intermediate node 90*b*, a source of the pMOS transistor 362 is connected to the intermediate node 90*a*, and a drain of the pMOS transistor 362 is connected to a source of the pMOS transistor 363. A gate of the pMOS transistor 363 is connected to the anti-phase node 91*b*, and a drain of the pMOS transistor 363 is connected to a drain of the nMOS transistor 342. In the present embodiment, the pMOS transistor 362 corresponds to the fifth MOS transistor, and the pMOS transistor 363 corresponds to the seventh MOS transistor.

A gate of the nMOS transistor 342 is connected to its own drain, and a source of the nMOS transistor 342 is connected to the VRL line 311*b*. A gate of the nMOS transistor 343 is connected to the gate of the nMOS transistor 342, a source of the nMOS transistor 343 is connected to the VRL line 311*b*, and a drain of the nMOS transistor 343 is connected to the in-phase node 91*a*. In the present embodiment, current is supplied to the in-phase node 91*a* by the nMOS transistors 342 and 343, with the VRL line 311*b* being used as a current source.

A gate of the pMOS transistor 364 is connected to the intermediate node 90*a*, a source of the pMOS transistor 364 is connected to the intermediate node 90*b*, and a drain of the pMOS transistor 364 is connected to a source of the pMOS transistor 365. A gate of the pMOS transistor 365 is connected to the in-phase node 91*a*, and a drain of the pMOS transistor 365 is connected to a drain of the nMOS transistor 344. In the present embodiment, the pMOS transistor 364 corresponds to the sixth MOS transistor, and the pMOS transistor 365 corresponds to the eighth MOS transistor.

A gate of the nMOS transistor 344 is connected to its own drain, and a source of the nMOS transistor 344 is connected to the VRL line 311*b*. A gate of the nMOS transistor 345 is connected to the gate of the nMOS transistor 344, and a source of the nMOS transistor 345 is connected to the VRL line 311*b*, and a drain of the nMOS transistor 345 is connected to the anti-phase node 91*b*. In the present embodiment, current is supplied to the in-phase node 91*a* by the nMOS transistors 344 and 345, with the VRL line 311*b* being used as a current source.

A gate of the nMOS transistor 346 is connected to the anti-phase node 91*b*, a source of the nMOS transistor 346 is connected to the VRL line 311*b*, and a drain of the nMOS transistor 346 is connected to the in-phase node 91*a*. A gate of the nMOS transistor 347 is connected to the in-phase node 91*a*, a source of the nMOS transistor 347 is connected to the VRL line 311*b*, and a drain of the nMOS transistor 347 is connected to the anti-phase node 91*b*. In the present embodiment, the nMOS transistors 346 and 347 form a potential retaining circuit that retains potentials of the in-phase node 91*a* and the anti-phase node 91*b*.

A gate of the pMOS transistor 366 is connected to the anti-phase node 91*b*, and a source of the pMOS transistor 366 is connected to the in-phase node 91*a*. A gate of the pMOS transistor 367 is connected to the in-phase node 91*a*, and a source of the pMOS transistor 367 is connected to the anti-phase node 91*b*. Thus, the pMOS transistors 366 and 367 form a cross-coupled circuit. In the present embodiment, the pMOS transistor 366 corresponds to the first MOS transistor, and the pMOS transistor 367 corresponds to the second MOS transistor.

The current regulator 322 includes pMOS transistors 368 and 369. A gate of the pMOS transistor 368 is connected to the intermediate node 90*a*, a source of the pMOS transistor 368 is connected to a drain of the pMOS transistor 366, and a drain of the pMOS transistor 368 is connected to the DVD line 310*a*. A gate of the pMOS transistor 369 is connected to the intermediate node 90*b*, a source of the pMOS transistor 369 is connected to a drain of the pMOS transistor 367, and a drain of the pMOS transistor 369 is connected to the DVD line 310*a*. In the present embodiment, the pMOS transistors 368 and 369 respectively include functions of interrupting current paths respectively connected (to the DVD line 310*a*) on a high-potential side of the in-phase node 91*a* and on a high-potential side of the anti-phase node 91*b*. In the present embodiment, the pMOS transistor 368 corresponds to the third MOS transistor, and the pMOS transistor 369 corresponds to the fourth MOS transistor.

The output section 323 is connected to the VRL power supply 311. The input section 320 includes an nMOS transistor 348 and a pMOS transistor 370 that are connected to each other through an intermediate node 90*c*, and an nMOS transistor 349 and a pMOS transistor 371 that are connected to each other through an intermediate node 90*d*.

Gates of the nMOS transistor 348 and the pMOS transistor 370 are each connected to the anti-phase node 91*b*, and the intermediate node 90*c* is connected to an LSOUT terminal. Further, gates of the nMOS transistor 349 and the pMOS transistor 371 are each connected to the in-phase node 91*a*, and the intermediate node 90*d* is connected to an XLSOUT terminal.

The respective MOS transistors included in the level shift circuit 300 are broadly classified into three types on the basis of a withstand voltage and a threshold voltage. A MOS transistor of a first type is a MOS transistor that has a withstand voltage for VRL domain (for example, 1.8 V). A MOS transistor of a second type is a MOS transistor that has a withstand voltage for VRL domain and of which a threshold voltage is set lower than a threshold voltage of the MOS transistor of the first type. A MOS transistor of a third type is a MOS transistor that has a withstand voltage for DVD domain (for example, 1.8 V).

The MOS transistor of the first type is, for example, a MOS transistor that has a withstand voltage of 1.8 V and of which a threshold voltage is set to SVT. Further, the MOS transistor of the second type is, for example, a MOS transistor that has a withstand voltage of 1.8 V and of which a threshold voltage is set to LVT. In the circuit diagram illustrated in FIG. 1, a circled MOS transistor is a MOS transistor of the second type, and a boxed MOS transistor is a MOS transistor of the third type. All of the other MOS transistors are MOS transistors of the first type.

As illustrated in FIG. 11, the pMOS transistors 360 and 361 of the input section 320, the pMOS transistors 362 and 364 of the potential supply section 321, and the pMOS transistors 368 and 369 of the current regulating section 322 are MOS transistors of the second type. As described above, the MOS transistor of the second type is a pMOS transistor in the present embodiment.

Further, the nMOS transistors 340 and 341 of the input section 320 are MOS transistors of the third type. As described above, the MOS transistor of the third type is an nMOS transistor in the present embodiment.

The level shift circuit 300 having such a configuration makes it possible to convert an input signal into a negative voltage level. The use of the level shift circuit 300 makes it possible to perform, for example, signal processing in a power supply system set to a negative voltage. Further, the provision of, for example, the current regulator 322 also makes it possible to properly perform an operation of a negative-level conversion when a voltage level of an input signal is sufficiently low.

Other Embodiments

The present technology is not limited to the embodiments described above, and can achieve various other embodiments.

In the embodiments above, a current-mirror circuit replicates current flowing through a first current path to supply an in-phase node with current obtained by the replication, and a current-mirror circuit replicates current flowing through a second current path to supply an anti-phase node with current obtained by the replication. For example, the current-mirror circuit may amplify current flowing through the first current path to supply the in-phase node with current obtained by the amplification, and the current-mirror circuit may amplify current flowing through the second current path to supply the anti-phase node with current obtained by the amplification.

Further, current may be supplied to the in-phase node and the anti-phase node without using the current-mirror circuits. For example, current may be supplied by opening and closing specified switch elements (such as MOS transistors) respectively connected to the in-phase node and the anti-phase node, on the basis of an input signal. In this case, connection between each node and a power supply line situated on a side opposite to a power supply line situated on a side supplied with current, is controlled as appropriate, and this makes it possible to form a current path independent of the P/N current performance ratio.

At least two of the features of the present technology described above can also be combined. In other words, various features described in the respective embodiments may be combined discretionarily regardless of the embodiments. Further, the various effects described above are not limitative but are merely illustrative, and other effects may be provided.

In the present disclosure, expressions such as "the same", "identical", and "orthogonal" include, in concept, expressions such as "substantially the same", "substantially identical", and "substantially orthogonal". For example, the expressions such as "the same", "equal", and "orthogonal" also respectively include states in specified ranges (such as a range of +/−10%), with expressions such as "exactly the same", "exactly identical", and "perfectly orthogonal" being respectively used as references.

Note that the present technology may also take the following configurations.

(1) A level shift circuit, including:
an input section to which an input signal of a first power supply system is input;
a supply section that includes a pair of nodes, the supply section being connected to one of a pair of power supply lines serving as a second power supply system of which a voltage level is higher than a voltage level of the first power supply system, the supply section supplying a potential of the one of the pair of power supply lines to one of the pair of nodes according to the input signal; and
a regulator that is connected to another of the pair of power supply lines, the regulator regulating current flowing between the one of the pair of nodes that is supplied with the potential of the one of the pair of power supply lines, and the other of the pair of power supply lines.

(2) The level shift circuit according to (1), in which
the pair of nodes is an in-phase node and an anti-phase node, the in-phase node being supplied with a potential, the supply of the potential to the in-phase node being performed in a state of being in phase with the input signal, the anti-phase node being supplied with a potential, the supply of the potential to the anti-phase node being performed in a state of being in anti-phase with respect to the input signal,
in the state of being in phase with the input signal, the regulator regulates current flowing between the in-phase node and the other of the pair of power supply lines, and
in the state of being in anti-phase with respect to the input signal, the regulator regulates current flowing between the anti-phase node and the other of the pair of power supply lines.

(3) The level shift circuit according to (2), in which
the supply section includes a first MOS transistor and a second MOS transistor, the first MOS transistor including a drain connected to the in-phase node and a gate connected to the anti-phase node, the second MOS transistor including a drain connected to the anti-phase node and a gate connected to the in-phase node, and
the regulator includes a third MOS transistor and a fourth MOS transistor, the third MOS transistor being connected between a source of the first MOS transistor and the other of the pair of power supply lines, the fourth MOS transistor being connected between a source of the second MOS transistor and the other of the pair of power supply lines.

(4) The level shift circuit according to (3), in which
the first and second MOS transistors are MOS transistors of a first type, the MOS transistor of the first type having a first withstand voltage corresponding to the voltage level of the second power supply system, and
the third and fourth MOS transistors are MOS transistors of a second type, the MOS transistor of the second type having the first withstand voltage and of which a threshold voltage is set lower than a threshold voltage of the MOS transistor of the first type.

(5) The level shift circuit according to (4), in which
the input section generates an in-phase signal in phase with the input signal, and an anti-phase signal in anti-phase with respect to the input signal,
the first to fourth MOS transistors are MOS transistors having the same polarity,
the anti-phase signal is applied to a gate of the third MOS transistor, and
the in-phase signal is applied to a gate of the fourth MOS transistor.

(6) The level shift circuit according to (4) or (5), in which
the supply section includes a first current-mirror circuit and a second current-mirror circuit, the first current-mirror circuit supplying current to the in-phase node, the second current-mirror circuit supplying current to the anti-phase node.

(7) The level shift circuit according to (6) in which
the first current-mirror circuit includes a first current path and a first switch section, the first current path being connected to the one of the pair of power supply lines, the first switch section being arranged in the first current path, the first current-mirror circuit replicating current flowing through the first current path to supply the in-phase node with current obtained by the replication, and
the second current-mirror circuit includes a second current path and a second switch section, the second current path being connected to the one of the pair of power supply lines, the second switch section being arranged in the second current path, the second current-mirror circuit replicating current flowing through the second current path to supply the anti-phase node with current obtained by the replication.

(8) The level shift circuit according to (7), in which
the input section generates an in-phase signal in phase with the input signal, and an anti-phase signal in anti-phase with respect to the input signal,
the first switch section includes a fifth MOS transistor that brings the first current path into conduction in response to the in-phase signal, and
the second switch section includes a sixth MOS transistor that brings the second current path into conduction in response to the anti-phase signal.

(9) The level shift circuit according to (8), in which
the fifth and sixth MOS transistors are MOS transistors of the second type,
the in-phase signal is applied to a gate of the fifth MOS transistor, and
the anti-phase signal is applied to a gate of the sixth MOS transistor.

(10) The level shift circuit according to (8) or (9), in which
the first switch section includes a seventh MOS transistor that interrupts the first current path in response to a potential of the anti-phase node, and
the second switch section includes an eighth MOS transistor that interrupts the second current path in response to a potential of the in-phase node.

(11) The level shift circuit according to (10), in which
the supply section includes a potential retaining circuit that retains the potential of the in-phase node on the basis of the potential of the anti-phase node, and retains the potential of the anti-phase node on the basis of the potential of the in-phase node.

(12) The level shift circuit according to any one of (8) to (11), in which
the anti-phase signal is applied to a source of the fifth MOS transistor, and
the in-phase signal is applied to a source of the sixth MOS transistor.

(13) The level shift circuit according to any one of (4) to (12), in which
the input section includes a MOS transistor of the second type and a MOS transistor of a third type, the MOS transistor of the third type having a second withstand voltage corresponding to the voltage level of the first power supply system.

(14) The level shift circuit according to (13), in which
the input section includes a first signal-generation circuit that generates an anti-phase signal in anti-phase with respect to the input signal, and an in-phase signal in phase with the input signal.

(15) The level shift circuit according to (14), in which
the one of the pair of power supply lines is a power supply line situated on a high-potential side of the second power supply system, and
the first signal-generation circuit includes an nMOS transistor of the second type and a pMOS transistor of the third type, the nMOS transistor of the second type being connected on a low-potential side of the first power supply system, the pMOS transistor of the third type being connected on a high-potential side of the first power supply system.

(16) The level shift circuit according to (14) or (15), in which
the supply section includes a pair of current paths each connected to the input section and the one of the pair of power supply lines, and
the input section includes a second signal-generation circuit that generates the in-phase signal in phase with the input signal, and the anti-phase signal in anti-phase with respect to the input signal, the generation of the in-phase signal and the anti-phase signal being performed on the basis of output of the first signal-generation circuit, the anti-phase signal and the in-phase signal being input to the pair of current paths.

(17) The level shift circuit according to (16), in which
the one of the pair of power supply lines is a power supply line situated on a high-potential side of the second power supply system, and
the second signal-generation circuit includes an nMOS transistor of the second type and an nMOS transistor of the third type, the nMOS transistor of the second type being connected on a low-potential side of the first power supply system, the nMOS transistor of the third type being connected on a high-potential side of the first power supply system.

(18) The level shift circuit according to any one of (4) to (17), in which
the one of the pair of power supply lines is a power supply line situated on a high-potential side of the second power supply system, and
the MOS transistor of the second type is an nMOS transistor.

(19) The level shift circuit according to any one of (4) to (14) and (16), in which the one of the pair of power supply lines is a power supply line situated on a low-potential side of the second power supply system, and the MOS transistor of the second type is a pMOS transistor.

(20) An electronic apparatus according to an embodiment of the present technology includes a power supply section and a level shift circuit.

The power supply section includes a first power supply system, and a second power supply system of which a voltage level is higher than a voltage level of the first power supply system.

The level shift circuit includes an input section to which an input signal of the first power supply system is input; a supply section that includes a pair of nodes, the supply section being connected to one of a pair of power supply lines serving as the second power supply system, the supply section supplying a potential of the one of the pair of power supply lines to one of the pair of nodes according to the input signal; and a regulator that is connected to another of the pair of power supply lines, the regulator regulating current flowing between the one of the pair of nodes that is supplied with the potential of the one of the pair of power supply lines, and the other of the pair of power supply lines.

REFERENCE SIGNS LIST 1 input signal
2 in-phase signal
3 anti-phase signal
5 pair of nodes
5b anti-phase node
5a in-phase node
10b DVS line
10a DVD line
10, 210, 310 DVD power supply
11, 211 AVD power supply
11b AVS line
11a AVD line
20, 220, 320 input section
21, 221, 321 potential supply section
22, 222, 322 current regulator
26b first current-mirror circuit
26a second current-mirror circuit
27 potential retaining circuit
29a first current path
29b second current path
50, 51, 250, 251 nMOS transistor
368, 369 pMOS transistor
100, 200, 300 level shift circuit

The invention claimed is:

1. A level shift circuit, comprising:
an input section configured to receive an input signal of a first power supply system;
a supply section that includes:
a pair of nodes;
a first MOS transistor; and
a second MOS transistor, wherein
the supply section is connected to a first power supply line of a pair of power supply lines of a second power supply system,
a voltage level of the second power supply system is higher than a voltage level of the first power supply system,
the supply section is configured to supply a potential of the first power supply line of the second power supply system to one of the pair of nodes according to the input signal,
the pair of nodes comprises:
an in-phase node supplied with the potential, wherein the supply of the potential to the in-phase node is performed in a first state of being in phase with the input signal; and
an anti-phase node supplied with the potential, wherein the supply of the potential to the anti-phase node is performed in a second state of being in anti-phase with respect to the input signal,
the first MOS transistor includes a drain connected to the in-phase node and a gate connected to the anti-phase node,
the second MOS transistor includes a drain connected to the anti-phase node and a gate connected to the in-phase node, and
the first MOS transistor and the second MOS transistor are MOS transistors of a first type having a first withstand voltage corresponding to the voltage level of the second power supply system; and
a regulator connected to a second power supply line of the pair of power supply lines, wherein
the regulator comprises a third MOS transistor and a fourth MOS transistor,
the third MOS transistor is connected between a source of the first MOS transistor and the second power supply line of the pair of power supply lines,
the fourth MOS transistor is connected between a source of the second MOS transistor and the second power supply line of the pair of power supply lines,
the third MOS transistor and the fourth MOS transistor are MOS transistors of a second type having the first withstand voltage,
a threshold voltage of the MOS transistors of the second type is set lower than a threshold voltage of the MOS transistors of the first type, and
the regulator is further configured to:
regulate current that flows between the in-phase node and the second power supply line of the pair of power supply lines, in the first state of being in phase with the input signal; and
regulate current that flows between the anti-phase node and the second power supply line of the pair of power supply lines, in the second state of being in anti-phase with respect to the input signal.

2. The level shift circuit according to claim 1, wherein the input section is configured to:
generate an in-phase signal in phase with the input signal, wherein the in-phase signal is applied to a gate of the fourth MOS transistor; and
generate an anti-phase signal in anti-phase with respect to the input signal, wherein
the first MOS transistor to the fourth MOS transistor are MOS transistors having a same polarity,
the anti-phase signal is applied to a gate of the third MOS transistor.

3. The level shift circuit according to claim 1, wherein
the supply section further includes a first current-mirror circuit and a second current-mirror circuit,
the first current-mirror circuit supplies current to the in-phase node, and
the second current-mirror circuit supplies current to the anti-phase node.

4. The level shift circuit according to claim 3, wherein
the first current-mirror circuit includes a first current path and a first switch section,
the first current path is connected to the one of the pair of power supply lines,
the first switch section is in the first current path,
the first current-mirror circuit replicates current flowing through the first current path to supply the in-phase node with the current obtained by the replication,
the second current-mirror circuit includes a second current path and a second switch section,
the second current path is connected to the one of the pair of power supply lines,
the second switch section is in the second current path, and
the second current-mirror circuit replicates current flowing through the second current path to supply the anti-phase node with the current obtained by the replication.

5. The level shift circuit according to claim 4, wherein
the input section is configured to generate an in-phase signal in phase with the input signal, and an anti-phase signal in anti-phase with respect to the input signal,
the first switch section includes a fifth MOS transistor that brings the first current path into conduction in response to the in-phase signal, and
the second switch section includes a sixth MOS transistor that brings the second current path into conduction in response to the anti-phase signal.

6. The level shift circuit according to claim 5, wherein
the fifth MOS transistor and the sixth MOS transistor are the MOS transistors of the second type,
the in-phase signal is applied to a gate of the fifth MOS transistor, and
the anti-phase signal is applied to a gate of the sixth MOS transistor.

7. The level shift circuit according to claim 5, wherein
the first switch section includes a seventh MOS transistor configured to interrupt the first current path in response to the potential of the anti-phase node, and
the second switch section includes an eighth MOS transistor configured to interrupt the second current path in response to the potential of the in-phase node.

8. The level shift circuit according to claim 7, wherein the supply section includes a potential retaining circuit configured to:
retain the potential of the in-phase node based on the potential of the anti-phase node; and
retain the potential of the anti-phase node based on the potential of the in-phase node.

9. The level shift circuit according to claim 5, wherein
the anti-phase signal is applied to a source of the fifth MOS transistor, and
the in-phase signal is applied to a source of the sixth MOS transistor.

10. The level shift circuit according to claim 1, wherein
the input section includes a MOS transistor of the second type and a MOS transistor of a third type, and
the MOS transistor of the third type having a second withstand voltage corresponding to the voltage level of the first power supply system.

11. The level shift circuit according to claim 10, wherein the input section includes a first signal-generation circuit configured to:
generate an anti-phase signal in anti-phase with respect to the input signal; and
generate an in-phase signal in phase with the input signal.

12. The level shift circuit according to claim 11, wherein
the first power supply line of the pair of power supply lines is on a high-potential side of the second power supply system,
the first signal-generation circuit includes an nMOS transistor of the second type and a pMOS transistor of the third type,
the nMOS transistor of the second type is connected on a low-potential side of the first power supply system, and
the pMOS transistor of the third type is connected on a high-potential side of the first power supply system.

13. The level shift circuit according to claim 11, wherein
the supply section includes a pair of current paths each connected to the input section and the first power supply line of the pair of power supply lines,
the input section further includes a second signal-generation circuit configured to generate the in-phase signal in phase with the input signal, and the anti-phase signal in anti-phase with respect to the input signal,
the generation of the in-phase signal and the anti-phase signal is based on output of the first signal-generation circuit, and
the anti-phase signal and the in-phase signal are input to the pair of current paths.

14. The level shift circuit according to claim 13, wherein
the first power supply line of the pair of power supply lines is on a high-potential side of the second power supply system,
the second signal-generation circuit includes an nMOS transistor of the second type and an nMOS transistor of the third type,
the nMOS transistor of the second type is connected on a low-potential side of the first power supply system, and
the nMOS transistor of the third type is connected on a high-potential side of the first power supply system.

15. The level shift circuit according to claim 1, wherein
the first power supply line of the pair of power supply lines is on a high-potential side of the second power supply system, and
each of the MOS transistors of the second type is an nMOS transistor.

16. The level shift circuit according to claim 1, wherein
the first power supply line of the pair of power supply lines is on a low-potential side of the second power supply system, and
each of the MOS transistors of the second type is a pMOS transistor.

17. An electronic apparatus, comprising:
a power supply section that includes a first power supply system and a second power supply system, wherein a voltage level of the second power supply system is higher than a voltage level of the first power supply system; and
a level shift circuit comprising:
an input section configured to receive an input signal of the first power supply system;
a supply section that includes:
a pair of nodes;
a first MOS transistor; and
a second MOS transistor, wherein
the supply section is connected to a first power supply line of a pair of power supply lines of the second power supply system,
the supply section is configured to supply a potential of the first power supply line of the second power supply system to one of the pair of nodes according to the input signal, the pair of nodes comprises:
- an in-phase node supplied with the potential, wherein the supply of the potential to the in-phase node is performed in a first state of being in phase with the input signal; and
- an anti-phase node supplied with the potential, wherein the supply of the potential to the anti-phase node is performed in a second state of being in anti-phase with respect to the input signal, the first MOS transistor includes a drain connected to the in-phase node and a gate connected to the anti-phase node, the second MOS transistor includes a drain connected to the anti-phase node and a gate connected to the in-phase node, and the first MOS transistor and the second MOS transistor are MOS transistors of a first type having a first withstand voltage corresponding to the voltage level of the second power supply system; and a regulator connected to a second power supply line of the pair of power supply lines, wherein
the regulator comprises a third MOS transistor and a fourth MOS transistor, the third MOS transistor is connected between a source of the first MOS transistor and the second power supply line of the pair of power supply lines, the fourth MOS transistor is connected between a source of the second MOS transistor and the second power supply line of the pair of power supply lines, the third MOS transistor and the fourth MOS transistor are MOS transistors of a second type having the first withstand voltage, a threshold voltage of the MOS transistors of the second type is set lower than a threshold voltage of the MOS transistors of the first type, and the regulator is further configured to:
- regulate current that flows between the in-phase node and the second power supply line of the pair of power supply lines, in the first state of being in phase with the input signal; and
- regulate current that flows between the anti-phase node and the second power supply line of the pair of power supply lines, in the second state of being in anti-phase with respect to the input signal.

* * * * *